(12) United States Patent
Park et al.

(10) Patent No.: US 12,507,543 B2
(45) Date of Patent: Dec. 23, 2025

(54) DISPLAY DEVICE

(71) Applicant: Samsung Display Co., LTD., Yongin-si (KR)

(72) Inventors: Ju Chan Park, Seoul (KR); Sun Ho Kim, Seongnam-si (KR); Gun Hee Kim, Seoul (KR); Chea Eun Kim, Seoul (KR); Sun Hee Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 789 days.

(21) Appl. No.: 17/752,369

(22) Filed: May 24, 2022

(65) Prior Publication Data

US 2023/0010411 A1   Jan. 12, 2023

(30) Foreign Application Priority Data

Jul. 8, 2021   (KR) .................. 10-2021-0089533

(51) Int. Cl.
*H10K 59/131*   (2023.01)
*H10D 86/40*   (2025.01)
*H10D 86/60*   (2025.01)
*H10K 59/121*   (2023.01)
*H10K 59/35*   (2023.01)

(52) U.S. Cl.
CPC ......... *H10K 59/131* (2023.02); *H10D 86/443* (2025.01); *H10D 86/60* (2025.01); *H10K 59/1213* (2023.02); *H10K 59/351* (2023.02); *H10K 59/353* (2023.02)

(58) Field of Classification Search
CPC ............ H10K 59/131; H10K 59/1213; H10K 59/351; H10K 59/353; H10K 59/123; H10K 50/125; H10D 86/443
See application file for complete search history.

(56) References Cited

U.S. PATENT DOCUMENTS

| 2019/0140025 | A1   | 5/2019  | Wang |
|---|---|---|---|
| 2022/0189358 | A1*  | 6/2022  | Kim ..................... G09G 3/03 |
| 2022/0285469 | A1*  | 9/2022  | Park ..................... H10K 59/123 |
| 2022/0359641 | A1   | 11/2022 | Kim et al. |
| 2022/0392983 | A1*  | 12/2022 | Choi .................... H10K 59/131 |
| 2024/0147785 | A1*  | 5/2024  | Wang .................. H10K 59/131 |

FOREIGN PATENT DOCUMENTS

| KR | 10-2017-0115923 A | 10/2017 |
|---|---|---|
| KR | 10-1962860 | 3/2019 |
| KR | 10-2020-0082072 | 7/2020 |
| KR | 10-2020-0087384 A | 7/2020 |
| KR | 10-2021-0010716 | 1/2021 |

* cited by examiner

*Primary Examiner* — Thanh Y. Tran
(74) *Attorney, Agent, or Firm* — F. CHAU & ASSOCIATES, LLC

(57) ABSTRACT

A display device according to an embodiment includes a display area that includes a first and a second display area, a first pixel circuit portion on the first display area, a first light emitting element connected to the first pixel circuit portion; a second pixel circuit portion on the second display area, second light emitting elements connected to the second pixel circuit portion, and a driving circuit portion connected to the first and second pixel circuit portions, and overlapping the second light emitting element. An edge of the display area includes a straight line portion and a rounded portion. An arrangement of the second light emitting elements is different in the straight line portion than in the rounded portion.

20 Claims, 29 Drawing Sheets

DISPLAY DEVICE

CROSS-REFERENCE TO RELATED APPLICATION(S)

This application claims priority to and benefits of Korean Patent Application No. 10-2021-0089533 under 35 U.S.C. § 119, filed on Jul. 8, 2021, in the Korean Intellectual Property Office, the entire contents of which are incorporated herein by reference.

BACKGROUND

1. Technical Field

The disclosure relates to a display device.

2. Description of the Related Art

A display device displays a screen, and includes a liquid crystal display (LCD), an organic light emitting diode (OLED) display, and the like. Such display devices may be used in electronic devices such as portable phones, navigation devices, digital cameras, electronic books, portable game devices, or terminals.

The display device may include a display area in which a screen is displayed and a peripheral area in which a screen is not displayed. Pixels may be disposed in the display area in the row direction and the column direction. In each pixel, devices such as transistors and capacitors and wires that can supply signals to these devices can be positioned. In the peripheral area, wires, scan drivers, data drivers, controllers, and the like that transmit electrical signals to drive these pixels may be positioned.

Although the demand for reducing the size of the peripheral area and expanding the display area is increasing, it is difficult to reduce the size of the peripheral area because of the area occupied by the driver may increase to support high resolutions and high speed operations.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device that may have an expanded display area.

The embodiments provide a display device that may have a rounded portion at an edge of a display device with a smooth curved shape.

A display device according to an embodiment may include a display area, the display area including a first display area and a second display area, a first pixel circuit portion that is disposed on the first display area, a first light emitting element that is electrically connected to the first pixel circuit portion, a second pixel circuit portion that is disposed on the second display area, second light emitting elements that are electrically connected to the second pixel circuit portion; and a driving circuit portion that is electrically connected to the first pixel circuit portion and to the second pixel circuit portion, and overlapping the second light emitting element in a plan view. An edge of the display area may include a straight line portion having a straight line shape and a rounded portion having a rounded shape. An arrangement form of the second light emitting elements disposed in the straight line portion and an arrangement form of the second light emitting elements disposed in the rounded portion may be different.

The display device may further include light emitting element groups, each of the light emitting element groups including eight of the second light emitting elements that are adjacent to each other in a first direction, and in a second direction that is perpendicular to the first direction. The second pixel circuit portion may be connected to two of the second light emitting elements. Edges of the light emitting element groups that are adjacent to each other in the second direction and are disposed in the straight light portion may be aligned with each other. Edges of light emitting element groups that are adjacent to each other in the second direction and are disposed in the rounded portion may be shifted from each other.

The eight of the second light emitting elements of each of the light emitting element groups may be arranged in a matrix format of 2×4. A distance the edges of light emitting groups that are adjacent to each other in the second direction and disposed in the rounded portion may be shifted from each other corresponds to one or two widths of one of the second light emitting elements.

The display device may further include light emitting element groups, each of the light emitting element groups including twelve of the second light emitting elements that are adjacent to each other in a first direction, and in a second direction that is perpendicular to the first direction. The second pixel circuit portion may be electrically connected to three second light emitting elements. Edges of the light emitting element groups that are adjacent to each other in the second direction and are disposed in the straight line portion may be aligned with each other. Edges of the light emitting element groups that are adjacent to each other in the second direction and are disposed in the rounded portion may be shifted from each other.

The twelve of the second light emitting elements of each of the light emitting element groups may be arranged in a matrix format of 2×6. A distance the edges of light emitting element groups that are adjacent to each other in the second direction and disposed in the rounded portion are shifted from each other may correspond to two or four widths of one of the second light emitting elements.

The display device may further include light emitting element groups, each of the light emitting element groups including sixteen of the second light emitting elements that are adjacent to each other in a first direction, and in a second direction that is perpendicular to the first direction. Four second light emitting elements may be electrically connected to the second pixel circuit portion. Edges of the light emitting element groups that are adjacent to each other in the second direction and are disposed in the straight line portion may be aligned. Edges of the light emitting element groups that are adjacent in the second direction and are disposed in the rounded portion may be shifted from each other.

The sixteen light emitting elements of each of the light emitting element groups may be arranged in a matrix format of 2×8. A distance the edges of light emitting element groups are shifted from each other may correspond to two or four widths of one of the second light emitting element.

The second pixel circuit portion may include a first sub-pixel circuit portion, a second sub-pixel circuit portion, a third sub-pixel circuit portion, and a fourth sub-pixel circuit portion. Each of the second light emitting elements may include first sub-light emitting elements that are electrically connected to the first sub-pixel circuit portion, second sub-light emitting elements that are electrically connected to the second sub-pixel circuit portion, third sub-light emitting elements that are electrically connected to the third sub-pixel circuit portion, and fourth sub-light emitting elements that are electrically connected to the fourth sub-pixel circuit portion.

The first sub-light emitting elements may emit red light. The second sub-light emitting elements may emit blue light. The third sub-light emitting elements and the fourth sub-light emitting elements may emit green light.

The display device according to the embodiment may further include an extension wire that electrically connects the second pixel circuit portion to the second light emitting elements.

The display device may further include a peripheral area surrounding the display area. The display area may display an image. The second display area may be disposed between the first display area and the peripheral area. A part of the driving circuit portion may overlap the second display area in a plan view. A remaining part of the driving circuit portion may overlap the peripheral area in a plan view.

The display device may further include light emitting element groups, each of the light emitting element groups including at least one of the second light emitting elements that are adjacent to each other in a first direction, and in a second direction that is perpendicular to the first direction. A number of second light emitting elements included in one of the light emitting element groups disposed in the rounded portion and a number of second light emitting elements included in one of the light emitting element groups disposed in the straight line portion may be different.

The number of second light emitting elements included in one of the light emitting element groups disposed in the rounded portion may be less than the number of second light emitting elements included in one of the light emitting element groups disposed in the straight line portion.

At least one of the light emitting element groups disposed in the rounded portion may include at least one of the second light emitting elements that is disposed on the edge with reference to a light emitting element group disposed on the straight line portion and may be turned off.

Sixteen of the second light emitting elements included in one of the light emitting element groups that are disposed in the straight line portion may be arranged in a matrix format of 2×8, and the light emitting element groups that are disposed in the rounded portion may have an arrangement form in which second light emitting elements disposed in the second row and the first column and the second row and the second column are turned off.

At least one of the second light emitting elements may include a pixel electrode electrically connected to the second pixel circuit portion; an emission layer disposed on the pixel electrode; and a common electrode disposed on the emission layer.

In an area where at least one of the second light emitting elements is turned off, the pixel electrode and the emission layer may not be disposed.

In an area where at least one of the second light emitting elements is turned off, the pixel electrode may be disposed, and the emission layer may not be disposed.

A width of a light emitting area of at least one of the second light emitting elements of one of the light emitting element groups disposed in the rounded portion may be narrower than a width of a light emitting area of at least one of the second light emitting elements disposed in the straight line portion.

A portion of the first display area may be disposed in an end of the rounded portion. The second display area may not be disposed in the end of the rounded portion.

According to the embodiments, a display device may have an expanded display area.

The display device according to the embodiments may have a smooth curved shape in the rounded portion of the edge of the display area.

BRIEF DESCRIPTION OF THE DRAWINGS

FIG. 9 and FIG. 10 show an arrangement form of the first pixel circuit portion and the second pixel circuit portion, and an arrangement form of the first light emitting element and the second light emitting element.

DETAILED DESCRIPTION OF THE EMBODIMENTS

Figure 1:
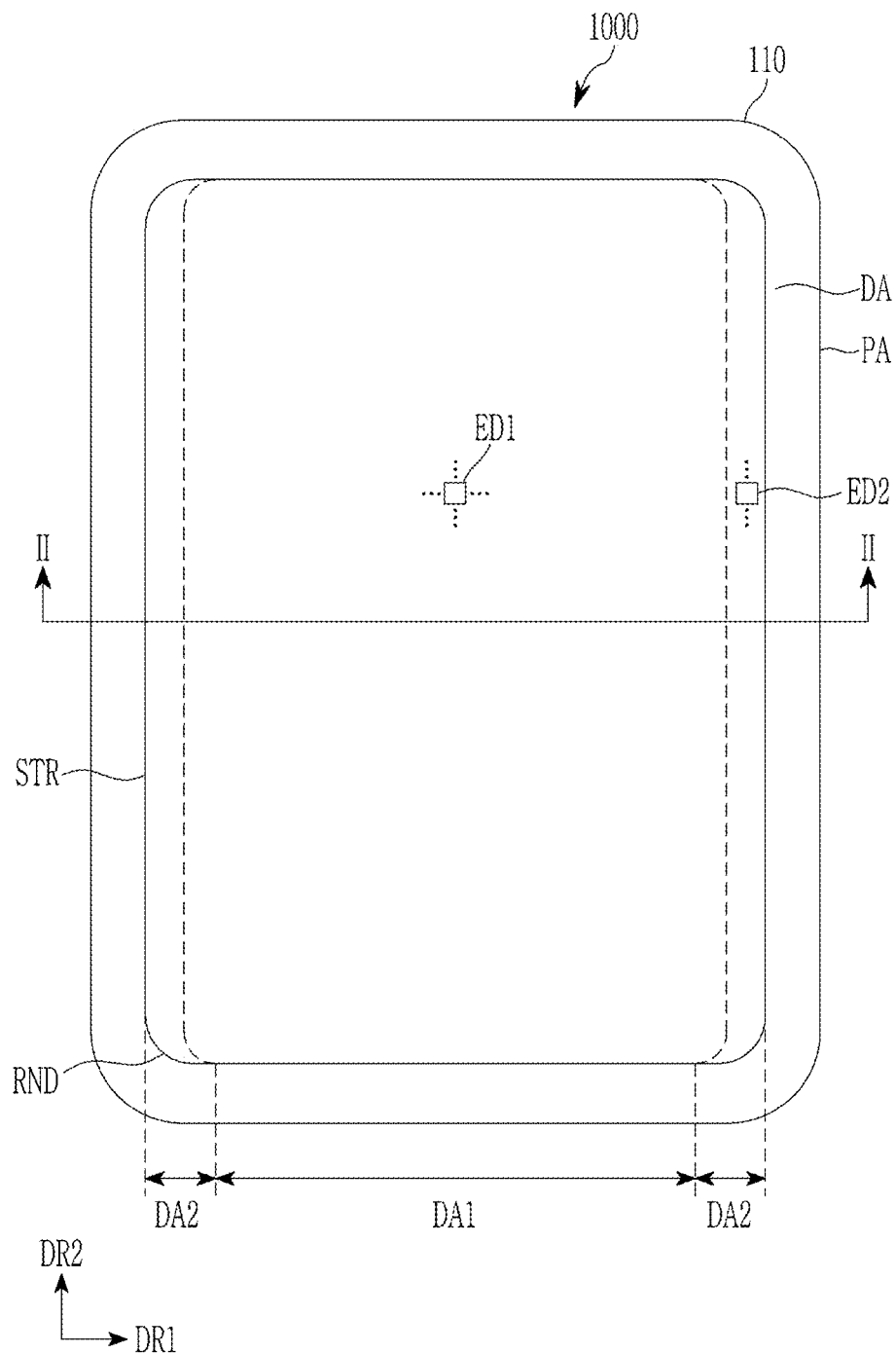
FIG. 1 is a schematic top plan view of a display device according to an embodiment.

The disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The drawings and description are to be regarded as illustrative in nature and not restrictive. Like reference numerals designate like elements throughout the specification.

In the drawings, size and thickness of each element are arbitrarily illustrated for convenience of description, and the embodiments are not necessarily limited to as illustrated in the drawings. In order to clearly express various layers and regions in the drawings, the thicknesses are enlarged. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "on" another element, it can be directly on the other element or intervening elements may also be present.

Unless explicitly described to the contrary, the word "comprise," and variations such as "comprises" or "comprising," will be understood to imply the inclusion of stated elements but not the exclusion of any other elements.

Throughout the specification, the phrase "in a plan view" means viewing a target portion from the top, and the phrase "in a cross-section" means viewing a cross-section formed by vertically cutting a target portion from the side.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Herein, the term "dead space" may be understood as a space which is devoted to accommodating one or more components that, either singularly or plurally, perform an intended function.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term a "matrix format" may be understood as elements substantially arranged in rows and columns in the shape of a matrix as understood by those of ordinary skill in the art. The term a "matrix format of MxN," where M and N are numbers, is intended to include matrices where the number of rows of the matrix may be M, the number of columns may be N, as well as matrices where the number of columns may be M, and the number of rows may be N.

Figure 2:
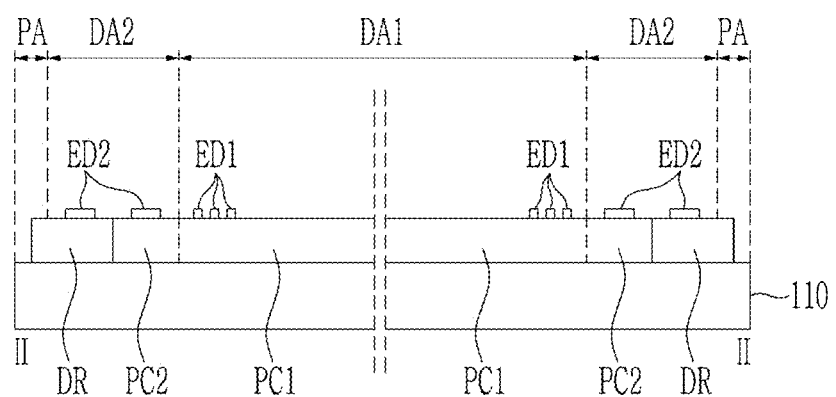
FIG. 2 is a schematic cross-sectional view of FIG. 1, taken along the line II-II.

Referring to FIG. 1 and FIG. 2, a display device according to an embodiment will be described.

FIG. 1 is a schematic top plan view of a display device according to an embodiment, and FIG. 2 is a schematic cross-sectional view of FIG. 1, taken along the line II-II.

As shown in FIG. 1 and FIG. 2, in an embodiment, display device 1000 may include substrate 110 and light emitting elements ED1 and ED2 positioned on substrate 110

The substrate 110 includes a display area DA and a peripheral area PA that is adjacent to the display area DA.

The display area DA may be disposed at a center portion of the display device 1000, and may be formed in the shape of an approximately quadrangle of which each corner portion is rounded. For example, edges of the display area DA may include straight line portions STR having a straight line shape and rounded portions RND having a rounded shape. However, the shape of the display area DA and the shape of the corners are not limited thereto, and may be variously changed. The display area DA may include a first display area DA1 and a second display area DA2 that is adjacent to the first display area DA1. The first display area DA1 may be disposed at a center of the display area DA, and the second display area DA2 may be disposed on both sides of the first display area DA1, for example, left and right. However, this is only an example, and positions of the first display area DA1 and the second display area DA2 may be changed. For example, the first display area DA1 may have a substantially quadrangular shape, and the second display area DA2 may surround four corners of the first display area DA1. For example, the second display area DA2 may be positioned to the left, right, upper, and lower sides of the first display area DA1.

The peripheral area PA may surround the display area DA. The peripheral area PA may be a region in which no image is displayed, and may be positioned at the periphery of the display device 1000.

At least a portion of the display device according to the embodiment may include a bent portion. For example, the central portion of the display device 1000 may be flat, and the edge portion may have a curved shape. At least a portion of the second display area DA2 may be positioned in the bent portion. That is, at least a portion of the second display area DA2 of the substrate 110 may have a curved shape.

Light emitting elements ED1 and ED2 may emit a selected light. For example, the light emitting elements ED1 and ED2 may emit red, green, and blue or white light. The display device 1000 may display a selected image through light emitted from the light emitting elements ED1 and ED2. The light emitting elements ED1 and ED2 may include a first light emitting element ED1 and a second light emitting element ED2. The light emitting elements ED1 and ED2 may be disposed in the display area DA. The first light emitting element ED1 may be disposed in the first display area DA1, and the second light emitting element ED2 may be disposed in the second display area DA2. Although not illustrated, the display device 1000 according to the embodiment may include multiple first light emitting elements ED1 and multiple second light emitting elements ED2. The first light emitting elements ED1 in the first display area DA1 may be disposed in the first direction DR1 and second direction DR2, and the second light emitting elements ED2 in the second display area DA2 may be disposed in the first direction DR1 and second direction DR2. A size of the first light emitting element ED1 and a size of the second light emitting element ED2 may be substantially similar or different from each other. For example, the size of the second light emitting element ED2 may be larger than the size of the first light emitting element ED1. The number of first light emitting elements ED1 per unit area and the number of second light emitting elements ED2 per unit area may be substantially similar or different from each other. For example, the number of second light emitting elements ED2 per unit area may be less than the number of first light emitting elements ED1 per unit area. The resolution of the first display area DA1 and the resolution of the second display area DA2 may be the same as or different from each other. For example, the resolution of the first display area DA1 may be higher than that of the second display area DA2. The alignment shape, size, and resolution of the first display area DA1 and the second display area DA2 of the first light emitting element ED1 and the second light emitting element ED2 are not limited thereto, and may be variously changed.

The display device 1000 according to the embodiment may further include pixel circuit portions PC1 and PC2 disposed on the substrate 110. The pixel circuit portions PC1 and PC2 may include a first pixel circuit portion PC1 and a second pixel circuit portion PC2. The display device according to the embodiment may include multiple first pixel circuit portions PC1 and multiple second pixel circuit portions PC2. The first pixel circuit portion PC1 indicates a region where the first pixel circuit portions PC1 are substantially arranged in a first direction DR1 and a second direction DR2, and the second pixel circuit portion PC2 indicates a region where the second pixel circuit portions PC2 are substantially arranged in the first direction DR1 and the second direction DR2. The arrangement form of the pixel circuit portions PC1 and PC2 is not particularly limited, and the pixel circuit portions PC1 and PC2 may be arranged in various forms. The first pixel circuit portion PC1 may be disposed in the first display area DA1, and the second pixel circuit portion PC2 may be disposed in the second display area DA2. Each of the pixel circuit portions PC1 and PC2 may be electrically connected to at least one of the light emitting elements ED1 and ED2. The first pixel circuit portion PC1 may be electrically connected to the first light emitting element ED1, and the second pixel circuit portion PC2 may be connected to the second light emitting element ED2. The second pixel circuit portions PC2 may be electrically connected to the second light emitting elements ED2. A size of a first pixel circuit portion PC1 and a size of a second pixel circuit portion PC2 may be substantially similar or different from each other. For example, the size of a second pixel circuit portion PC2 may be larger than the size of a first pixel circuit portion PC1. A structure of the first pixel circuit portion PC1 and a structure of the second pixel circuit portion PC2 may be different from each other.

The display device 1000 according to the embodiment may further include a driving circuit portion DR disposed on the display device 1000. The driving circuit portion DR may be electrically connected to the first pixel circuit portion PC1 and the second pixel circuit portion PC2. The driving circuit portion DR may include multiple driver and signal wires. For example, the driving circuit portion DR may include a scan driver, a data driver, a driving voltage supply line, a common voltage supply line, and signal transmission wires electrically connected to the scan driver, the data driver, the driving voltage supply line, and the common voltage supply line. The scan driver generates a scan signal and transmits the scan signal to the pixel circuit portions PC1 and PC2 through a scan line. The data driver generates a data signal and transmits the data signal to the pixel circuit portions PC1 and PC2 through a data line. The driving voltage supply line transmits a driving voltage to the pixel circuit portions PC1 and PC2. The common voltage supply line transmits a common voltage to an electrode of each of the light emitting elements ED1 and ED2. At least a part of the driving circuit portion DR may be disposed in the second display area DA2, and a part of the rest may be disposed in the peripheral area PA.

In the first display area DA1, the first pixel circuit portion PC1 may be electrically connected to the first light emitting element ED1 disposed on the first pixel circuit portion PC1. A light emission area of the first light emitting element ED1 may overlap the first pixel circuit portion PC1 electrically connected to the first light emitting element ED1. The first display area DA1 is an area where light is emitted by the first light emitting elements ED1.

In the second display area DA2, the second pixel circuit portion PC2 may be electrically connected to the second light emitting element ED2 disposed at a selected distance from the second pixel circuit portion PC2. A light emission area of the second light emitting element ED2 may not overlap the second pixel circuit portion PC2 connected thereto. The light emission area of the second light emitting element ED2 may overlap a second pixel circuit portion PC2 that is not connected to the second light emitting element ED2. The light emission area of the second light emitting element ED2 may also overlap the driving circuit portion DR. A part of the light emission area of the second light emitting element ED2 may overlap the second pixel circuit portion PC2 electrically connected to the second light emitting element ED2. The second display area DA2 is an area where light is emitted by the second light emitting element ED2.

In a display device, a pixel circuit portion and a light emitting element display area may be disposed in a display area, a driving circuit portion may be disposed in a peripheral area that surrounds the display area. A pixel circuit portion and a light emitting element may not be disposed in the peripheral area. Thus, light is not emitted in the peripheral area where the driving circuit portion is disposed, and a dead space may be formed. In the display device according to an embodiment, the second light emitting element ED2 is disposed at a portion where the driving circuit portion DR is disposed to emit light, and thus a region in which the screen is displayed can be expanded. The dead space may be reduced, and the bezel may be reduced by disposing the second light emitting element ED2 on the driving circuit portion DR.

Hereinafter, referring to FIG. 3 and FIG. 4, a connection relationship between each pixel circuit portion and a light emitting element of the display device according to the embodiment will be described.

Figure 3:
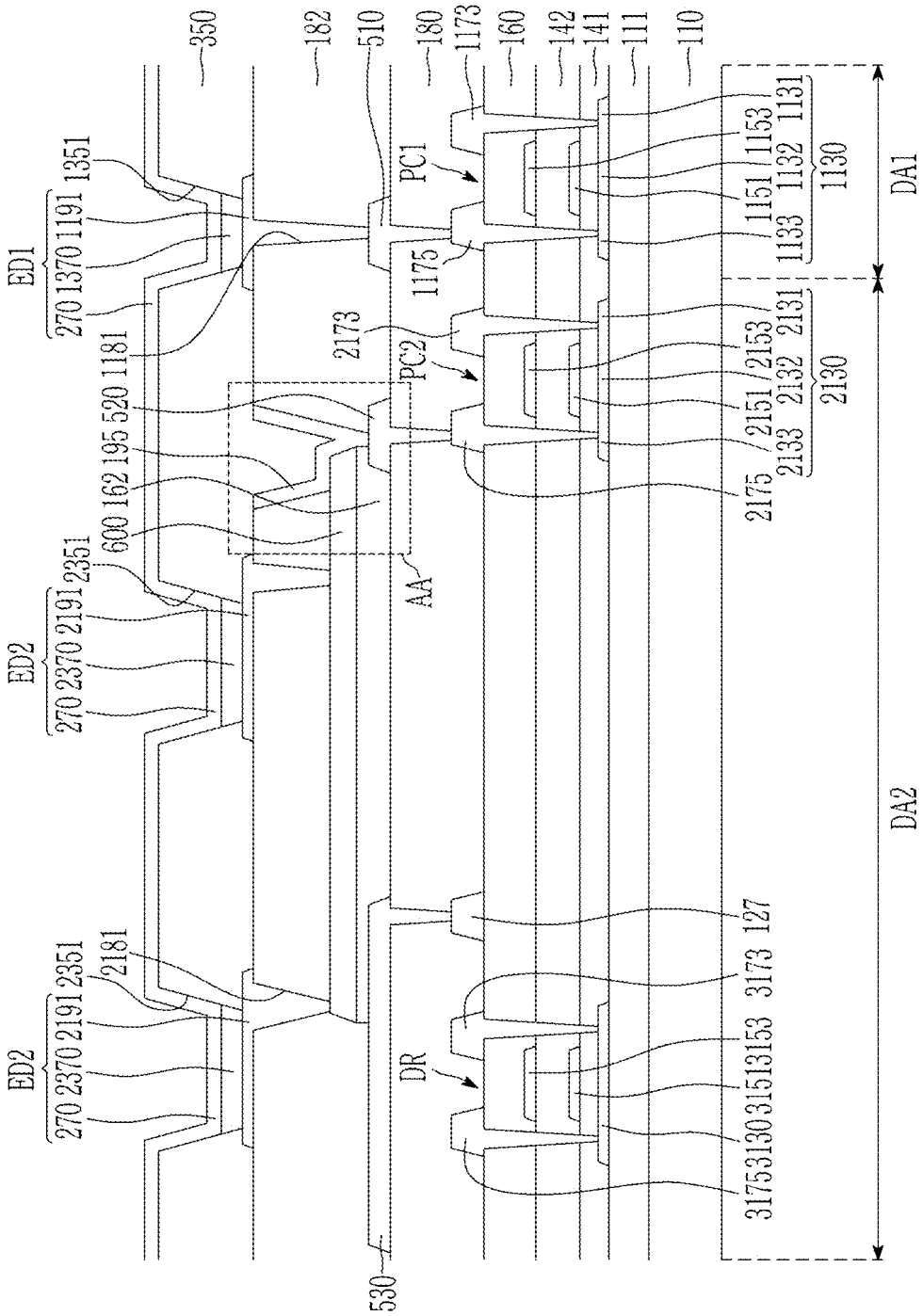
FIG. 3 is a schematic cross-sectional view of a part of the display device according to the embodiment.
Figure 4:
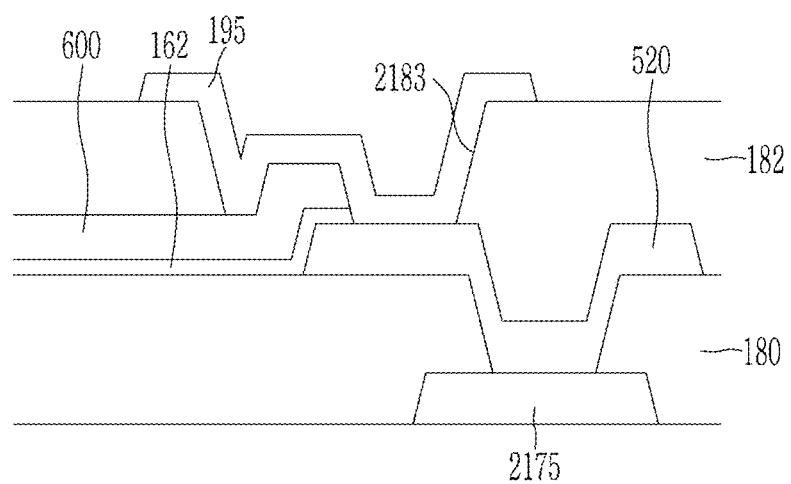
FIG. 4 is a schematic cross-sectional view of enlarging area AA of FIG. 3.

FIG. 3 is a schematic cross-sectional view of a part of the display device according to the embodiment, and FIG. 4 is a schematic cross-sectional view enlarging area AA of FIG. 3.

First, as shown in FIG. 3, the light emission area of the first light emitting element ED1 of the display device according to the embodiment may overlap the first pixel circuit portion PC1 electrically connected to the first light emitting element ED1.

The first pixel circuit portion PC1 may include a semiconductor 1130, a gate electrode 1151, a source electrode 1173, and a drain electrode 1175 disposed on the first display area DA1 of the substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material that can be bent or folded, and may include a single layer or multiple layers.

A buffer layer 111 may be disposed on the substrate 110. The buffer layer 111 may have a single-layered or multi-layered structure. The buffer layer 111 may include an inorganic insulating material such as a silicon nitride ($SiN_x$), a silicon oxide ($SiO_x$), a silicon oxynitride ($SiO_xN_y$), and the like, or an organic insulating material. The buffer layer 111 may be omitted as necessary. A barrier layer may further be disposed between the substrate 110 and the buffer layer 111. The barrier layer may have a single-layered or multi-layered structure. The barrier later may include an inorganic insulating material such as a silicon nitride ($SiN_x$), a silicon oxide ($SiO_x$), a silicon oxynitride ($SiO_xN_y$), and the like.

A semiconductor layer that includes a semiconductor 1130 of the first pixel circuit portion PC1 may be disposed on the buffer layer 111. The semiconductor 1130 may include a first region 1131, a channel 1132, and a second region 1133. A first region 1131 and a second region 1133 may be respectively disposed at opposite sides of the channel 1132 of the first pixel circuit portion PC1. The semiconductor 1130 of the first pixel circuit portion PC1 may include a semiconductor material such as amorphous silicon, polysilicon, an oxide semiconductor, and the like.

A first gate insulating layer 141 may be disposed on the semiconductor 1130 of the first pixel circuit portion PC1. The first gate insulating layer 141 may have a single-layered or multi-layered structure. The first gate insulating layer 141 may include an inorganic insulating material such as a silicon nitride ($SiN_x$), a silicon oxide ($SiO_x$), a silicon oxynitride ($SiO_xN_y$), and the like.

A first gate conductive layer that includes a gate electrode 1151 of the first pixel circuit portion PC1 may be disposed on the first gate insulating layer 141. The gate electrode 1151 of the first pixel circuit portion PC1 may overlap the channel 1132 of the semiconductor 1130. The first gate conductive layer may have a single-layered or multi-layered structure. The first gate conductive layer may include a metallic material such as molybdenum (Mo), aluminum (Al), copper (Cu), and/or titanium (Ti). A doping process or plasma treatment may be carried out after forming the first gate conductive layer. A portion of the semiconductor layer, covered by the first gate conductive layer is not doped or plasma-treated, and a portion of the semiconductor layer, not covered by the first gate conductive layer, is doped or plasma-treated such that the portion may have the same characteristic as a conductor.

A second gate insulating layer 142 may be disposed on the first gate conductive layer including the gate electrode 1151 of the first pixel circuit portion PC1. The second gate insulating layer 142 may have a single-layered or multi-layered structure. The second gate insulating layer 142 an inorganic insulating material such as a silicon nitride ($SiN_x$), a silicon oxide ($SiO_x$), a silicon oxynitride ($SiO_xN_y$), and the like.

A second gate conductive layer including a first storage electrode 1153 may be disposed on the second gate insulating layer 142. The second gate conductive layer may have a single-layered or multi-layered structure. The second gate conductive layer may include a metallic material such as molybdenum (Mo), aluminum (Al), copper (Cu), and/or titanium (Ti). The first storage electrode 1153 overlaps the gate electrode 1151 such that a storage capacitor is formed.

A first interlayer insulating layer 160 may be disposed on a second gate conductive layer including the first storage electrode 1153. The first interlayer insulating layer 160 may have a single-layered or multi-layered structure. The first interlayer insulating layer 160 may include an inorganic insulating material or an organic insulating material.

A first data conductive layer that includes a source electrode 1173 and a drain electrode 1175 of the first pixel circuit portion PC1 may be disposed on the first interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first interlayer insulating layer 160 may include an opening that overlaps the source electrode 1173 of the first pixel circuit portion PC1 and the first region 1131 of the semiconductor 1130. The source electrode 1173 of the first pixel circuit portion PC1 may be electrically connected to the first region 1131 of the semiconductor 1130 through the opening. The first interlayer insulating layer 160 may include an opening that overlaps the drain electrode 1175 of the first pixel circuit portion PC1 and the second region 1133 of the semiconductor 1130. The drain electrode 1175 of the first pixel circuit portion PC1 may be electrically connected to the second region 1133 of the semiconductor 1130 through the opening.

A first protective layer 180 may be disposed on the first data conductive layer including the source electrode 1173 and the drain electrode 1175 of the first pixel circuit portion PC1. The first protective layer 180 may include an inorganic insulating material such as a silicon nitride (SiN$_x$), a silicon oxide (SiO$_x$), a silicon oxynitride (SiO$_x$N$_y$), and/or an organic insulating material such as a polyimide, an acryl-based polymer, and a siloxane-based polymer.

A second data conductive layer that includes a connection electrode 510 of the first pixel circuit portion PC1 may be disposed on the first protective layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first protective layer 180 may include an opening that overlaps the drain electrode 1175 of the first pixel circuit portion PC1. The connection electrode 510 of the first pixel circuit portion PC1 may be electrically connected to the drain electrode 1175 through the opening.

A second protective layer 182 may be disposed on the second data conductive layer including the connection electrode 510 of the first pixel circuit portion PC1. The second protective layer 182 may include an organic insulating material such as a general-purpose polymer such as polymethyl methacrylate (PMMA) or polystyrene (PS), a polymer derivative having a phenolic group, an acryl-based polymer, an imide-based polymer, a polyimide, an acryl-based polymer, or a siloxane-based polymer.

The first light emitting element ED1 electrically connected to the first pixel circuit portion PC1 may be disposed on the second protective layer 182. The first light emitting element ED1 may include a pixel electrode 1191, an emission layer 1370, and a common electrode 270.

A pixel electrode 1191 of the first light emitting element ED1 may be disposed on the second protective layer 182. The second protective layer 182 may include an opening 1181 that overlaps the pixel electrode 1191 of the first light emitting element ED1 and the connection electrode 510 of the first pixel circuit portion PC1. The pixel electrode 1191 of the first light emitting element ED1 may be electrically connected to the connection electrode 510 of the first pixel circuit portion PC1 through the opening 1181. Thus, the pixel electrode 1191 of the first light emitting element ED1 may be connected to the drain electrode 1175 of the first pixel circuit portion PC1 through the connection electrode 510.

A partitioning wall 350 may be disposed on the pixel electrode 1191 of the first light emitting element ED1. A pixel opening 1351 is formed in the partitioning wall 350, and the pixel opening 1351 of the partitioning wall 350 may overlap the pixel electrode 1191.

An emission layer 1370 of the first light emitting element ED1 may be disposed in the pixel opening 1351 of the partitioning wall 350. The emission layer 1370 may overlap the pixel electrode 1191.

A common electrode 270 may be disposed on the emission layer 1370 and the partitioning wall 350.

The first light emitting element ED1 emits light around a region where the pixel electrode 1191, the emission layer 1370, and the common electrode 270 overlap. The light emission area of the first light emitting element ED1 may overlap the first pixel circuit portion PC1 connected to the first light emitting element ED1.

Each first light emitting element ED1 may display at least one of a first color, a second color, and a third color. For example, the first light emitting element ED1 may display red R, green G, and blue B colors.

The light emission area of the second light emitting element ED2 of the display device according to the embodiment may or may not overlap the second pixel circuit portion PC2 electrically connected to the second light emitting element ED2. Some of the second light emitting elements ED2 may overlap the second pixel circuit portion PC2 electrically connected to the second light emitting elements ED2. Other second light emitting elements ED2 may overlap the driving circuit portion DR.

The second pixel circuit portion PC2 may include a semiconductor 2130, a gate electrode 2151, a source electrode 2173, and a drain electrode 2175 positioned on the second display area DA2 of the substrate 110. The driving circuit portion DR may include a semiconductor 3130, a gate electrode 3151, a source electrode 3173, and a drain electrode 3175 positioned on the second display area DA2 of the substrate 110.

The buffer layer 111 may be positioned on the substrate 110, and the semiconductor 2130 of the second pixel circuit portion PC2 and the semiconductor 3130 of the driving circuit portion DR may be positioned on the buffer layer 111. The semiconductor 2130 of the second pixel circuit portion PC2 and the semiconductor 3130 of the driving circuit portion DR may be positioned in the semiconductor layer. The semiconductor 1130 of the second pixel circuit portion PC2 may include a first region 1131, a channel 1132, and a second region 1133.

The first gate insulating layer 141 may be disposed on the semiconductor 2130 of the second pixel circuit portion PC2 and the semiconductor 3130 of the driving circuit portion DR, and the gate electrode 2151 of the second pixel circuit portion PC2 and the gate electrode 3151 of the driving circuit portion DR may be disposed on the first gate insulating layer 141. The gate electrode 2151 of the second pixel circuit portion PC2 and the gate electrode 3151 of the driving circuit portion DR may be disposed on the first gate conductive layer. The gate electrode 2151 of the second pixel circuit portion PC2 may overlap the channel 2132 of the semiconductor 2130.

The second gate insulating layer 142 may be disposed on the gate electrode 2151 of the second pixel circuit portion PC2 and the gate electrode 3151 of the driving circuit portion DR, and a first storage electrode 2153 of the second pixel circuit portion PC2 and a first storage electrode 3153 of the driving circuit portion DR may be disposed on the second gate insulating layer 142. The first storage electrode 2153 of the second pixel circuit portion PC2 may overlap the gate electrode 2151 of the second pixel circuit portion PC2.

The first storage electrode 3153 of the driving circuit portion DR may overlap the gate electrode 3151 of the driving circuit portion DR.

A first interlayer insulating layer 160 may be disposed on the first storage electrode 2153 of the second pixel circuit portion PC2 and the first storage electrode 3153 of the driving circuit portion DR. The source electrode 2173 and the drain electrode 2175 of the second pixel circuit portion PC2 and the source electrode 3173 and the drain electrode 3175 of the driving circuit portion DR may be disposed on the first interlayer insulating layer 160. The source electrode 2173 and the drain electrode 2175 of the second pixel circuit portion PC2 and the source electrode 3173 and the drain electrode 3175 of the driving circuit portion DR may be disposed on the first data conductive layer.

The first interlayer insulating layer 160 may include an opening that overlaps the source electrode 2173 of the second pixel circuit portion PC2 and the first region 2131 of the semiconductor 2130. The source electrode 2173 of the second pixel circuit portion PC2 may be electrically connected to the first region 2131 of the semiconductor 2130 through the opening. The first interlayer insulating layer 160 may include an opening that overlaps the drain electrode 2175 of the second pixel circuit portion PC2 and the second region 2133 of the semiconductor 2130. The drain electrode 2175 of the second pixel circuit portion PC2 may be electrically connected to the second region 2133 of the semiconductor 2130 through the opening. Similarly, the source electrode 3173 of the driving circuit portion DR may be electrically connected to the first region of the semiconductor 3130, and the drain electrode 3175 may be electrically connected to the second region of the semiconductor 3130.

The first data conductive layer may further include an initialization voltage line 127. The initialization voltage line 127 may transmit an initialization voltage Vint. The initialization voltage Vint may be a constant voltage. For example, a constant voltage may be applied to the initialization voltage line 127.

The first protective layer 180 may be disposed on the source electrode 2173 and the drain electrode 2175 of the second pixel circuit portion PC2 and the source electrode 3173 and the drain electrode 3175 of the driving circuit portion DR.

The connection electrode 520 of the second pixel circuit portion PC2 may be disposed on the first protective layer 180. The connection electrode 520 of the second pixel circuit portion PC2 may be disposed in the second data conductive layer. The first protective layer 180 may include an opening that overlaps the drain electrode 2175 of the second pixel circuit portion PC2. The connection electrode 520 of the second pixel circuit portion PC2 may be electrically connected to the drain electrode 2175 through the opening.

The second data conductive layer may further include a shield electrode 530. The first protective layer 180 may include an opening that overlaps the initialization voltage line 127. The shield electrode 530 may be electrically connected to the initialization voltage line 127 through the opening. The shield electrode 530 may overlap the driving circuit portion DR, and may cover the driving circuit portion DR. The shield electrode 530 may receive the initialization voltage Vint through the initialization voltage line 127.

The shield electrode 530 may be disposed between the driving circuit portion DR and the second light emitting element ED2. The second light emitting element ED2 may overlap the driving circuit portion DR, and may be affected by a voltage applied to the driving circuit portion DR. In the display device according to the embodiment, the effect of the driving circuit portion DR on the second light emitting element ED2 may be shielded by the shield electrode 530 to which a constant voltage such as the initialization voltage Vint is applied. In FIG. 3, the shield electrode 530 is electrically connected to the initialization voltage line 127, but the embodiments are not limited thereto. The shield electrode 530 may be electrically connected to another wire, and a constant voltage may be applied to the shield electrode 530. For example, the shield electrode 530 may be connected to a wire to which a common voltage ELVSS (refer to FIG. 5) is applied.

A second interlayer insulating layer 162 may be disposed on the connection electrode 520 of the second pixel circuit portion PC2. A portion of the connection electrode 520 of the second pixel circuit portion PC2 may be covered by the second interlayer insulating layer 162, and another portion of the connection electrode 520 of the second pixel circuit portion PC2 may be covered by the second protective layer 182.

An extension wire 600 may be disposed on the second interlayer insulating layer 162. The extension wire 600 may be electrically connected to the connection electrode 520 of the second pixel circuit portion PC2, and their connection will be described in more detail with reference to FIG. 4, enlarging area AA of FIG. 3. The extension wire 600 and the second interlayer insulating layer 162 may be simultaneously patterned by using the same mask. Thus, the extension wire 600 may have a planar shape substantially equivalent to the second interlayer insulating layer 162. The extension wire 600 may be disposed only in the second display area DA2 and may not be disposed in the first display area DA1. The second interlayer insulating layer 162 may also be disposed only in the second display area DA2 and may not be disposed in the first display area DA1. Thus, the second interlayer insulating layer 162 may at least partially overlap the second pixel circuit portion PC2 and the second light emitting element ED2, and may not overlap at all with the first pixel circuit portion PC1 and the first light emitting element ED1. Since the extension wire 600 and the second interlayer insulating layer 162 are simultaneously patterned, the number of masks used in a manufacturing process of the display device according to the embodiment can be reduced. Accordingly, it is possible to reduce process cost, time, and the like. The extension wire 600 may overlap a portion of an edge of the connection electrode 520 of the second pixel circuit portion PC2. The second interlayer insulating layer 162 is disposed between the extension wire 600 and the connection electrode 520 of the second pixel circuit portion PC2, and the extension wire 600 and the connection electrode 520 of the second pixel circuit portion PC2 are not directly connected. The extension wire 600 may also overlap the shield electrode 530 (refer to FIG. 3). The second interlayer insulating layer 162 is disposed between the extension wire 600 and the shield electrode 530 (refer to FIG. 3). The extension wire 600 and the shield electrode 530 may be insulated by the second interlayer insulating layer 162.

The second protective layer 182 is disposed on the connection electrode 520 of the second pixel circuit portion PC2 and the extension wire 600. The second protective layer 182 includes an overlapping portion of the connection electrode 520 of the second pixel circuit portion PC2 and an opening that overlaps the periphery of the overlapping portion. A bridge electrode 195 may be disposed on the second protective layer 182. The bridge electrode 195 may be positioned on the same layer as the pixel electrode 1191 (refer to FIG. 3) of the first light emitting element ED1 (refer to FIG. 3). The bridge electrode 195 is disposed in the opening 2183, and may be connected to the connection electrode 520 of the second pixel circuit portion PC2 and the extension wire 600 in the opening 2183. Thus, the extension wire 600 and the connection electrode 520 of the second pixel circuit portion PC2 may be connected by the bridge electrode 195.

Referring to FIG. 3, multiple second light emitting elements ED2 connected to the second pixel circuit portion PC2 may be disposed on the second protective layer 182. For example, the second pixel circuit portion PC2 may be connected to two second light emitting elements ED2. However, the number of second light emitting elements ED2 electrically connected to the second pixel circuit portion PC2 is not limited thereto, and the second pixel circuit portion PC2 may be connected to three or more second light emitting elements ED2. Each second light emitting element ED2 may include a pixel electrode 2191, an emission layer 2370, and a common electrode 270.

The pixel electrode 2191 of each second light emitting element ED2 may be disposed on the second protective layer 182. The pixel electrode 2191 of the second light emitting element ED2, the pixel electrode 1191 of the first light emitting element ED1, and the bridge electrode 195 may be disposed on the same layer. The second protective layer 182 may include an opening 2181 that overlaps the pixel electrode 2191 of the second light emitting element ED2 and the extension wire 600. The pixel electrode 2191 of each second light emitting element ED2 may be connected to the extension wire 600 through the opening 2181. The extension wire 600 may be electrically connected to the second pixel circuit portion PC2 through the bridge electrode 195. Thus, the extension wire 600 may electrically connect the second pixel circuit portion PC2 to the second light emitting elements ED2. At least a part of the second light emitting elements ED2 may be distanced away from the second pixel circuit portion PC2 rather than overlapping the second pixel circuit portion PC2. The extension wire 600 may electrically connect the second light emitting elements ED2 and the second pixel circuit portion PC2 that are separated from each other.

FIG. 3 illustrates that the second pixel circuit portion PC2 and the second light emitting element ED2 may be electrically connected by the extension wire 600, but the embodiments are not limited. The extension wire 600 may be omitted, and the second light emitting element ED2's pixel electrode 2191 may be extended and electrically connected to the second pixel circuit portion PC2 that is positioned at a distance. The pixel electrodes 2191 of the second light emitting elements ED2 may extend, and may be connected to a second pixel circuit portion PC2 by bypassing adjacent pixels to avoid collision with the adjacent pixels. However, in case that the extension wire 600 is omitted, complicated designs may be required to extend the pixel electrode 2191, and to avoid short circuit failures. In case that an extension wire 600 may be used, the extension wire 600 and the pixel electrode 2191 of the second light emitting element ED2 may be disposed on different layers. Thus, the wire design may be simplified, and short circuit failures may be prevented.

A partitioning wall 350 may be disposed on the pixel electrode 2191 of the second light emitting element ED2. A pixel opening 2351 may be formed in the partitioning wall 350, and the pixel opening 2351 of the partitioning wall 350 may overlap the pixel electrode 2191.

An emission layer 2370 of the second light emitting element ED2 may be disposed in the pixel opening 2351 of the partitioning wall 350. The emission layer 2370 may overlap the pixel electrode 2191.

A common electrode 270 may be disposed on the emission layer 2370 and the partitioning wall 350. The common electrode 270 of the second light emitting element ED2 and the common electrode 270 of the first light emitting element ED1 may be integral with each other, and may be positioned as a whole in most regions on the substrate 110.

The second light emitting element ED2 emits light around a region where the pixel electrode 2191, the emission layer 2370, and the common electrode 270 overlap, and a light emission area of the second light emitting element ED2 may or may not overlap a second pixel circuit portion PC2 electrically connected to the second light emitting element ED2.

In the display device according to the embodiment, the second light emitting element ED2 may be disposed not only in an area where the second pixel circuit portion PC2 is disposed but also in an area where the driving circuit portion DR is disposed. Thus, the region where the screen is displayed can be expanded. The pixel density in the second display area DA2 may be relatively lower than the pixel density in the first display area DA1. The size of the second light emitting element ED2 may be increased to increase luminance of the second light emitting element ED2 to compensate for the decreased pixel density. Accordingly, in order to supply more current to the second light emitting element ED2, the size of each element such as the storage capacitor included in the second pixel circuit portion PC2 may be large. The area occupied by the second pixel circuit portion PC2 may be widened. For example, the area of a second pixel circuit portion PC2 may be about twice an area of a first pixel circuit portion PC1. The area of the second light emitting element ED2 may be about twice the area of the first light emitting element ED1. However, this is only an example, and areas of the second pixel circuit portion PC2 and the second light emitting element ED2 may be set in various ways.

The second light emitting elements ED2 may be electrically connected to a second pixel circuit portion PC2 such that resolution of the second display area DA2 can be substantially increased. The resolution of the second display area DA2 may be set to be similar to the resolution of the first display area DA1.

Although the first and second pixel circuit portions PC1 and PC2 have been illustrated with only one transistor, the first and second pixel circuit portions PC1 and PC2 may include multiple transistors. Hereinafter, an example of a pixel of the display device according to the embodiment will be described.

Figure 5:
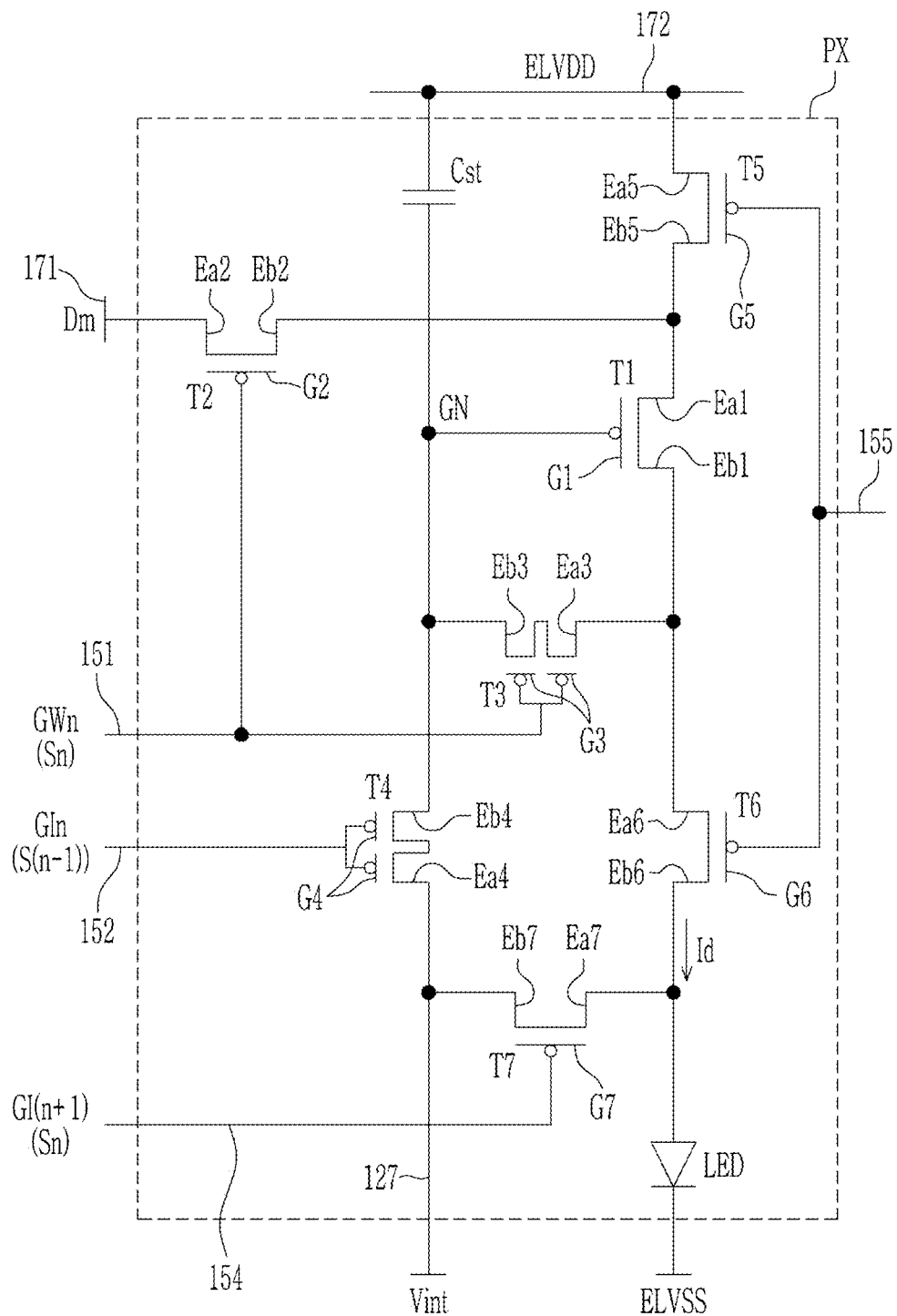
FIG. 5 is a schematic diagram of an equivalent circuit of a pixel of a display device according to an embodiment.

FIG. 5 is a schematic diagram an equivalent circuit of a pixel of a display device according to an embodiment.

As shown in FIG. 5, a display device an embodiment includes pixels PX that can display an image, and signal lines 127, 151, 152, 153, 154, 171, and 172. A pixel PX may include a multiple transistors T1, T2, T3, T4, T5, T6, and T7 connected to signal lines 127, 151, 152, 153, 154, 171, and 172, a capacitor Cst, and at least one light emitting diode LED. In the embodiment, each pixel PX will be illustrated as including a single light emitting diode LED.

The signal lines 127, 151, 152, 154, 155, 171, and 172 may include an initialization voltage line 127, scan lines 151, 152, and 154, a light emission control line 155, a data line 171, and a driving voltage line 172.

The initialization voltage line 127 may transmit an initialization voltage Vint. The scan lines 151, 152, and 154 may respectively transmit scan signals GWn, GIn, and GI(n+1). The scan signals GWn, GIn, and GI(n+1) may be a gate-on voltage and a gate-off voltage for turning on/turning off the transistors T2, T3, T4, and T7 included in the pixel PX.

The scan lines 151, 152, and 154 connected to a pixel PX may include a first scan line 151 that can transmit the scan signal GWn, a second scan line 152 that can transmit the scan signal GIn having a gate-on voltage at different timing from that of the first scan line 151, and a third scan line 154 that can transmit the scan signal GI(n+1). In the embodiment, an example in which the second scan line 152 transmits the gate-on voltage at earlier timing than the first scan line 151 will be mainly described. For example, when the scan signal GWn is the n-th scan signal Sn (n is a natural number greater than 1) applied during a frame, the scan signal GIn may be a previous stage scan signal such as an (n−1)th scan signal S(n−1) and the scan signal GI(n+1) may be the (n+1)th scan signal S(n+1). However, the embodiment is not limited thereto, and the scan signal GI(n+1) may be a different scan signal from the n-th scan signal (Sn).

The light emission control line 155 may transmit a control signal such as a light emission control signal EM that may control light emission of the light emitting diode LED included in the pixel PX. A control signal transmitted by the light emission control line 155 may have a gate-on voltage and a gate-off voltage, and may have a different waveform from a scan signal transmitted by the scan line 151, 152, and 154.

The data line 171 may transmit a data signal Dm, and the driving voltage line 172 may transmit a driving voltage ELVDD. The data signal Dm may have a different voltage level according to an image signal input to the display device, and the driving voltage ELVDD may have a substantially constant level.

Although not illustrated, the display device may further include a driving circuit portion that transmits a signal to the signal lines 127, 151, 152, 153, 154, 171, and 172.

Transistors included in a pixel PX may include a first transistor T1, a second transistor T2, a third transistor T3, a fourth transistor T4, a fifth transistor T5, a sixth transistor T6, and a seventh transistor T7.

The first scan line 151 may transmit a scan signal GWn to the second transistor T2 and the third transistor T3, the second scan line 152 may transmit a scan signal GIn to the fourth transistor T4, the third scan line 154 may transmit a scan signal GI(n+1) to the seventh transistor T7, and the light emission control line 155 may transmit a light emission control signal EM to the fifth transistor T5 and the sixth transistor T6.

A gate electrode G1 of the first transistor T1 may be electrically connected to a first end of the capacitor Cst through the driving gate node GN, a first electrode Ea1 of the first transistor T1 may be electrically connected to the driving voltage line 172 via the fifth transistor T5, and a second electrode Eb1 of the first transistor T1 may be electrically connected to an anode of the light emitting diode LED via the sixth transistor T6. The first transistor T1 may receive the data signal Dm transmitted by the data line 171 according to a switching operation of the second transistor T2 and may supply a driving current Id to the light emitting diode LED.

A gate electrode G2 of the second transistor T2 may be electrically connected to the first scan line 151, a first electrode Ea2 of the second transistor T2 may be electrically connected to the data line 171, and a second electrode Eb2 of the second transistor T2 may be electrically connected to the first electrode Ea1 of the first transistor T1, and electrically connected to the driving voltage line 172 via the fifth transistor T5. The second transistor T2 may be turned on according to the scan signal GWn transmitted through the first scan line 151, and may transmit the data signal Dm transmitted from the data line 171 to the first electrode Ea1 of the first transistor T1.

A gate electrode G3 of the third transistor T3 may be electrically connected to the first scan line 151, and a first electrode Ea3 of the third transistor T3 may be electrically connected to the second electrode Eb1 of the first transistor T1 and may be electrically connected to the anode of the light emitting diode LED via the sixth transistor T6. A second electrode Eb3 of the third transistor T3 may be electrically connected to a second electrode Eb4 of the fourth transistor T4, the first end of the capacitor Cst, and the gate electrode G1 of the first transistor T1. The third transistor T3 may be turned on according to the scan signal GWn received through the first scan line 151, and the gate electrode G1 of the first transistor T1 and the second electrode Eb1 may be electrically connected to each other to diode-connect the first transistor T1.

A gate electrode G4 of the fourth transistor T4 may be electrically connected to the second scan line 152, a first electrode Ea4 of the fourth transistor T4 may be electrically connected to a terminal of the initialization voltage Vint, and a second electrode Eb4 of the fourth transistor T4 may be electrically connected to the first end of the capacitor Cst and the gate electrode G1 of the first transistor T1 via the second electrode Eb3 of the third transistor T3. The fourth transistor T4 is turned on by the scan signal GIn received through the second scan line 152 and transmits the initialization voltage Vint to the gate electrode G1 of the first transistor T1, thereby performing an initialization operation for initialization of a voltage of the gate electrode G1 of the first transistor T1.

A gate electrode G5 of the fifth transistor T5 may be electrically connected to the light emission control line 155, a first electrode Ea5 of the fifth transistor T5 may be electrically connected to the driving voltage line 172, and a second electrode Eb5 of the fifth transistor T5 may be electrically connected to the first electrode Ea1 of the first transistor T1 and the second electrode Eb2 of the second transistor T2.

A gate electrode G6 of the sixth transistor T6 may be electrically connected to the light emission control line 155, a first electrode Ea6 of the sixth transistor T6 may be electrically connected to the second electrode Eb1 of the first transistor T1 and the first electrode Ea3 of the third transistor T3, and a second electrode Eb6 of the sixth transistor T6 may be electrically connected to the anode of light emitting diode LED. The fifth transistor T5 and the sixth transistor T6 are simultaneously turned on by the light emission control signal EM received through the light emission control line 155, and thus the driving voltage ELVDD is compensated through the diode-connected first transistor T1 and transmitted to the light emitting diode LED.

A gate electrode G7 of the seventh transistor T7 may be electrically connected to the third scan line 154, a first electrode Ea7 of the seventh transistor T7 may be electrically connected to the second electrode Eb6 of the sixth transistor T6 and the anode of the light emitting diode LED, and a second electrode Eb7 of the seventh transistor T7 may be electrically connected to the initialization voltage Vint terminal and the first electrode Ea4 of the fourth transistor T4.

The transistors T1, T2, T3, T4, T5, T6, and T7 may be P-type channel transistors such as PMOS, but are not limited thereto, and at least one may be an N-type channel transistor.

The first end of the capacitor Cst may be electrically connected to the gate electrode G1 of the first transistor T1 as described above, and a second end may be electrically connected to the driving voltage line 172. A cathode of the light emitting diode LED may be electrically connected to the common voltage ELVSS terminal, which transmits the common voltage ELVSS to receive the common voltage ELVSS.

A pixel positioned in the first display area DA1 and a pixel positioned in the second display area DA2 may both have a circuit structure of the pixel PX shown in FIG. 5. However, the embodiments are not limited thereto, and a circuit structure of a pixel positioned in the first display area DA1 may be different from a circuit structure of a pixel positioned in the second display area DA2. The circuit diagram of the pixel shown in FIG. 5 is only an example, and the number of transistors, the number of capacitors, and their connection relationships included in a pixel PX of the display device according to the embodiment can be changed.

In the display device according to the embodiment, each first pixel circuit portion PC1 may be electrically connected to a first light emitting element ED1, and each second pixel circuit portion PC2 may be electrically connected to multiple second light emitting elements ED2. The first light emitting element ED1 and the second light emitting element ED2 may be disposed in various forms. Hereinafter, arrangement forms of the first pixel circuit portion PC1 and the first light emitting element ED1, arrangement forms of the second pixel circuit portion PC2 and the second light emitting element ED2, and the connections of the second light emitting elements ED2 will be described.

Figure 6:
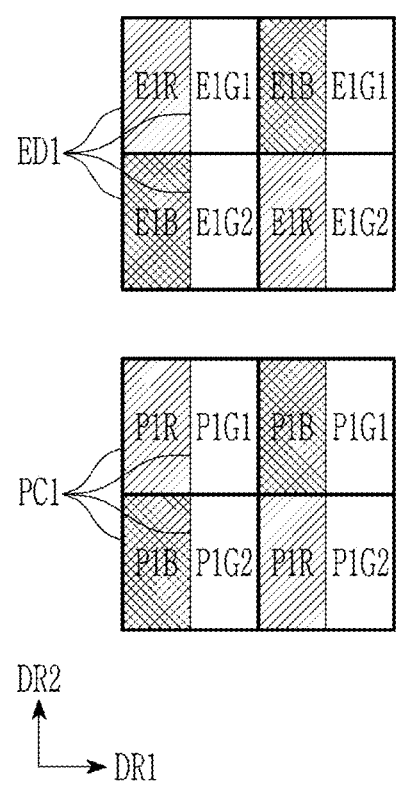
FIG. 6 shows an arrangement form of a first pixel circuit portion of the display device and an arrangement form of a first light emitting element, respectively, according to the embodiment.

Referring to FIG. 6, the arrangement form of the first pixel circuit portion PC1 and the first light emitting element ED1 will be described as follows.

FIG. 6 shows the arrangement form of the first pixel circuit portion of the display device and the arrangement form of the first light emitting element, respectively, according to an embodiment. In FIG. 6, for convenience of description, the first pixel circuit portion PC1 and the first light emitting element ED1 are illustrated separately, but the first pixel circuit portion PC1 may overlap the first light emitting element ED1 in a plan view.

As shown in FIG. 6, first light emitting elements ED1 may be disposed along the first direction DR1 and the second direction DR2 on the first display area of the substrate of the display device according to the embodiment. The second direction DR2 may be perpendicular to the first direction DR1. The first direction DR1 may be a row direction, and the second direction DR2 may be a column direction. The first pixel circuit portions PC1 may be disposed along the first direction DR1 and the second direction DR2 on the first display area of the substrate of the display device according to an embodiment. The first pixel circuit portions PC1 disposed in the first direction DR1 may be electrically connected to the same scan line, and the first pixel circuit portions PC1 disposed in the second direction DR2 may be electrically connected to the same data line.

The first light emitting element ED1 may include a first sub-light emitting element E1R, a second sub-light emitting element EiB, a third sub-light emitting element E1G1, and a fourth sub-light emitting element E1G2. Each of the first sub-light emitting element E1R, the second sub-light emitting element EiB, the third sub-light emitting element E1G1, and the fourth sub-light emitting element E1G2 may emit light of a selected color. For example, the first sub-light emitting element E1R may emit red light, and the second sub-light emitting element EiB may emit blue light. The third sub-light emitting element E1G1 and the fourth sub-light emitting element E1G2 may emit green light. The first sub-light emitting element E1R and the third sub-light emitting element E1G1 may be adjacent in the first direction DR1, and the second sub-light emitting element E1B and the fourth sub-light emitting element E1G2 may be adjacent in the first direction DR1. The first sub-light emitting element E1R and the second sub-light emitting element E1B may be adjacent in the second direction DR2, and the third sub-light emitting element E1G1 and the fourth sub-light emitting element E1G2 may be adjacent in the second direction DR2.

The first pixel circuit portion PC1 may include a first sub-pixel circuit portion P1R, a second sub-pixel circuit portion P1B, a third sub-pixel circuit portion P1G1, and a fourth sub-pixel circuit portion P1G2. The first sub-pixel circuit portion P1R may be electrically connected to the first sub-light emitting element E1R, and they may overlap each other. The second sub-pixel circuit portion P1B may be electrically connected to the second sub-light emitting element E1B, and they may overlap each other. The third sub-pixel circuit portion P1G1 may be electrically connected to the third sub-light emitting element E1G1, and they may overlap each other. The fourth sub-pixel circuit portion P1G2 may be electrically connected to the fourth sub-light emitting element E1G2, and they may overlap each other. The first pixel circuit portion PC1 may overlap and may be electrically connected to the first light emitting element ED1. The first sub-pixel circuit portion P1R and the third sub-pixel circuit portion P1G1 may be adjacent in the first direction DR1, and the second sub-pixel circuit portion P1B and the fourth sub-pixel circuit portion P1G2 may be adjacent in the first direction DR1. The first sub-pixel circuit portion P1R and the second sub-pixel circuit portion P1B may be adjacent in the second direction DR2, and the third sub-pixel circuit portion P1G1 and the fourth sub-pixel circuit portion P1G2 may be adjacent in the second direction DR2.

Four sub-pixel circuit portions P1R, P1B, P1G1, and P1G2 and four sub-light emitting elements E1R, E1B, E1G1, and E1G2 may form one pixel group. Multiple pixel groups may be repeatedly disposed in the first display area.

Figure 7:
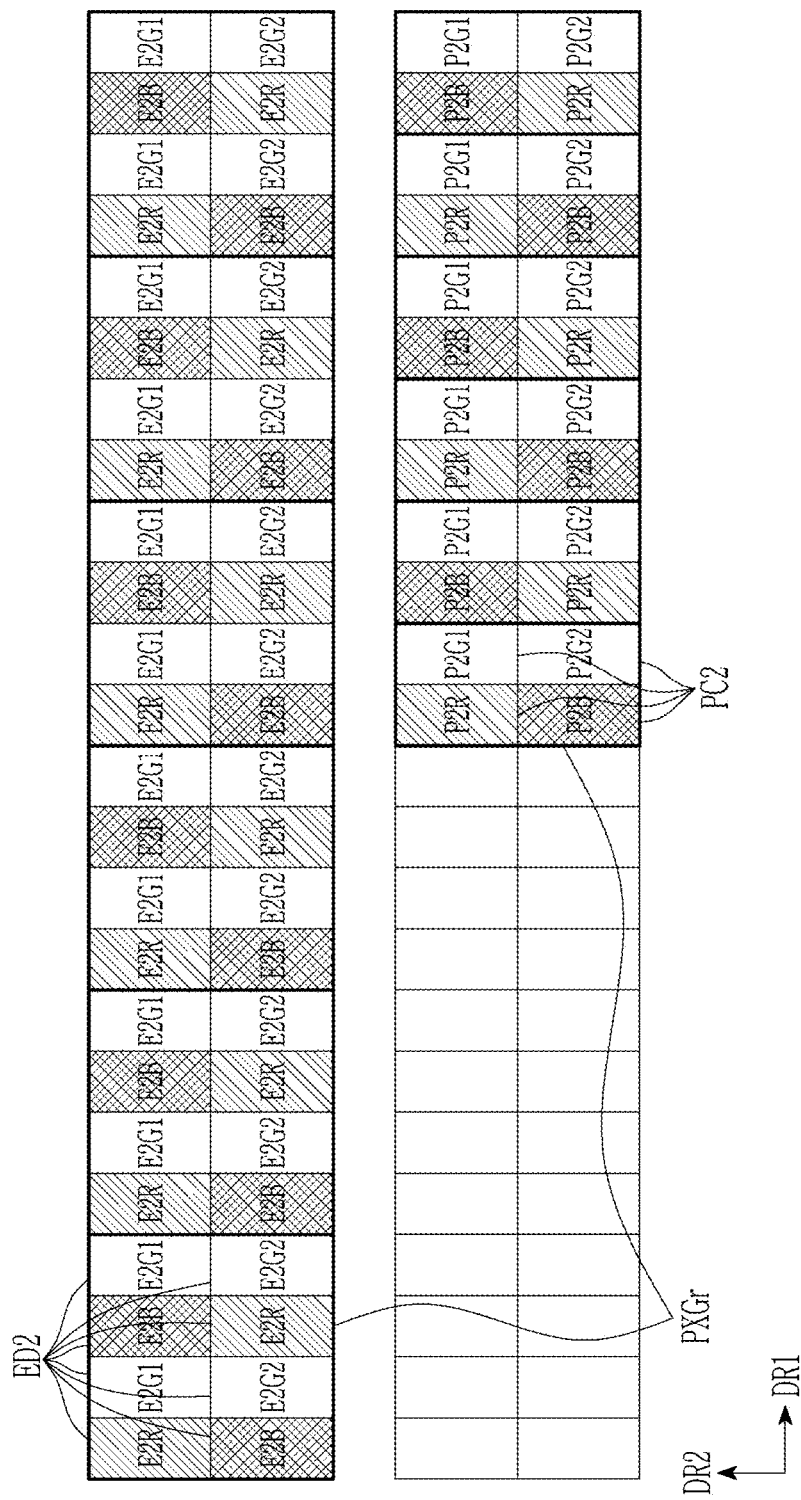
FIG. 7 shows an arrangement form of a second pixel circuit portion of the display device and an arrangement form of a second light emitting element, respectively, according to the embodiment.
Figure 8:
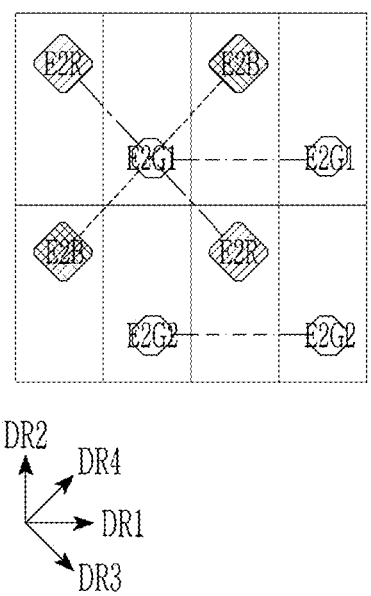
FIG. 8 shows a connection of the second light emitting elements of the display device according to the embodiment.

Referring to FIG. 7 and FIG. 8, when each second pixel circuit portion PC2 is electrically connected to two second light emitting elements ED2, the arrangement form of the second pixel circuit portion PC2 and the second light emitting elements ED2 and the electrical connection of the second light emitting elements ED2 will be described as follows.

FIG. 7 shows an arrangement form of the second pixel circuit portion of the display device and an arrangement form of the second light emitting element, respectively, according to the embodiment. In FIG. 7, the second pixel circuit portion PC2 and the second light emitting element ED2 are separated for convenience of description, but substantially, the second pixel circuit portion PC2 may overlap some of the second light emitting elements ED2 in a plan view. FIG. 8 shows the electrical connection of the second light emitting elements ED2 of the display device according to the embodiment.

As shown in FIG. 7 and FIG. 8, second light emitting elements ED2 may be disposed along the first direction DR1 and the second direction DR2 on the second display area of the substrate of the display device according to the embodiment. Second pixel circuit portions PC2 may be disposed along the first direction DR1 and the second direction DR2 on the second display area DA2 (refer to FIG. 1) of the substrate of the display device according to an embodiment. The second pixel circuit portions PC2 disposed along the first direction DR1 may be electrically connected to the same scan line, and the second pixel circuit portions PC2 disposed along the second direction DR2 may be electrically connected to the same data line.

The second light emitting element ED2 may include a first sub-light emitting element E2R, a second sub-light emitting element E2B, a third sub-light emitting element E2G1, and a fourth sub-light emitting element E2G2. The first sub-light emitting element E2R, the second sub-light emitting element E2B, the third sub-light emitting element E2G1, and the fourth sub-light emitting element E2G2 may respectively emit light of selected colors. For example, the first sub-light emitting element E2R may emit red light, and the second sub-light emitting element E2B may emit blue light. The third sub-light emitting element E2G1 and the fourth sub-light emitting element E2G2 may emit green light. In a first row, the first sub-light emitting element E2R, the third sub-light emitting element E2G1, the second sub-light emitting element E2B, and the third sub-light emitting element E2G1 may be sequentially disposed along the first direction DR1. In a second row, the second sub-light emitting element E2B, the fourth sub-light emitting element E2G2, the first sub-light emitting element E2R, and the fourth sub-light emitting element E2G2 may be sequentially disposed along the first direction DR1. The first sub-light emitting element E2R and the second sub-light emitting element E2B may be adjacent in the second direction DR2, and the third sub-light emitting element E2G1 and the fourth sub-light emitting element E2G2 may be adjacent in the second direction DR2.

The second pixel circuit portion PC2 may include a first sub-pixel circuit portion P2R, a second sub-pixel circuit portion P2B, a third sub-pixel circuit portion P2G1, and a fourth sub-pixel circuit portion P2G2. The first sub-pixel circuit portion P2R may be electrically connected to two first sub-light emitting elements E2R. The second sub-pixel circuit portion P2B may be electrically connected to two second sub-light emitting elements E2B. The third sub-pixel circuit portion P2G1 may be electrically connected to two third sub-light emitting elements E2G1. The fourth sub-pixel circuit portion P2G2 may be electrically connected to two fourth sub-light emitting elements E2G2. The second pixel circuit portion PC2 may not overlap the electrically connected second light emitting elements ED2. The second pixel circuit portion PC2 may overlap a second light emitting element ED2 that is not electrically connected the second pixel circuit portion PC2. The first sub-pixel circuit portion P2R and the third sub-pixel circuit portion P2G1 may be adjacent in the first direction DR1, and the second sub-pixel circuit portion P2B and the fourth sub-pixel circuit portion P2G2 may be adjacent in the first direction DR1. The first sub-pixel circuit portion P2R and the second sub-pixel circuit portion P2B may be adjacent in the second direction DR2, and the third sub-pixel circuit portion P2G1 and the fourth sub-pixel circuit portion P2G2 may be adjacent in the second direction DR2.

The two first sub-light emitting elements E2R electrically connected to the first sub-pixel circuit portion P2R may be disposed along the third direction DR3. For example, two first sub-light emitting elements E2R adjacent along the third direction DR3 may be electrically connected to each other to receive the same signal and exhibit the same luminance. The third direction DR3 may be an oblique direction with respect to the first direction DR1 and the second direction DR2. The two second sub-light emitting elements E2B electrically connected to the second sub-pixel circuit portion P2B may be disposed along a fourth direction DR4. For example, two second sub-light emitting elements E2B adjacent along the fourth direction DR4 may be electrically connected to each other to receive the same signal and exhibit the same luminance. The fourth direction DR4 may be an oblique direction with respect to the first direction DR1 and the second direction DR2. The fourth direction DR4 may be a direction perpendicular to the third direction DR3. The two third sub-light emitting elements E2G1 electrically connected to the third sub-pixel circuit portion P2G1 may be disposed along the first direction DR1. For example, two third sub-light emitting elements E2G1 adjacent along the first direction DR1 may be electrically connected to each other to receive the same signal and exhibit the same luminance. The two fourth sub-light emitting elements E2G2 electrically connected to the fourth sub-pixel circuit portion P2G2 may be disposed along the first direction DR1. For example, two fourth sub-light emitting elements E2G2 adjacent along the first direction DR1 may be electrically connected to each other to receive the same signal and exhibit the same luminance.

Four sub-pixel circuit portions P2R, P2B, P2G1, and P2G2 and eight sub-light emitting elements E2R, E2B, E2G1, and E2G2 may form a pixel group PXGr. Multiple pixel groups PXGr may be repeatedly disposed in the second display area. A second pixel circuit portion PC2 of a first pixel group PXGr positioned at the leftmost side may be electrically connected to a second light emitting elements ED2 of the first pixel group PXGr. The second pixel circuit portion PC2 of the first pixel group PXGr may not overlap the second light emitting elements ED2 of the first pixel group PXGr. The second pixel circuit portion PC2 of the first pixel group PXGr may overlap at least a portion of the second light emitting elements ED2 of a fourth pixel group PXGr. The second pixel circuit portion PC2 of the second pixel group PXGr may overlap at least a portion of the second light emitting element ED2 of the fourth pixel group PXGr. A second pixel circuit portion PC2 of third and fourth pixel groups PXGr may overlap at least a portion of a second light emitting element ED2 of a fifth pixel group PXGr. A second pixel circuit portion PC2 of fifth and sixth pixel groups PXGr may overlap at least a portion of a second light emitting element ED2 of a sixth pixel group PXGr.

Hereinafter, referring to FIG. 9 and FIG. 10, an arrangement relationship between the first pixel circuit portion PC1 and the second pixel circuit portion PC2 and an arrangement relationship between the first light emitting element ED1 and the second light emitting element ED2 will be described.

Figure 9:
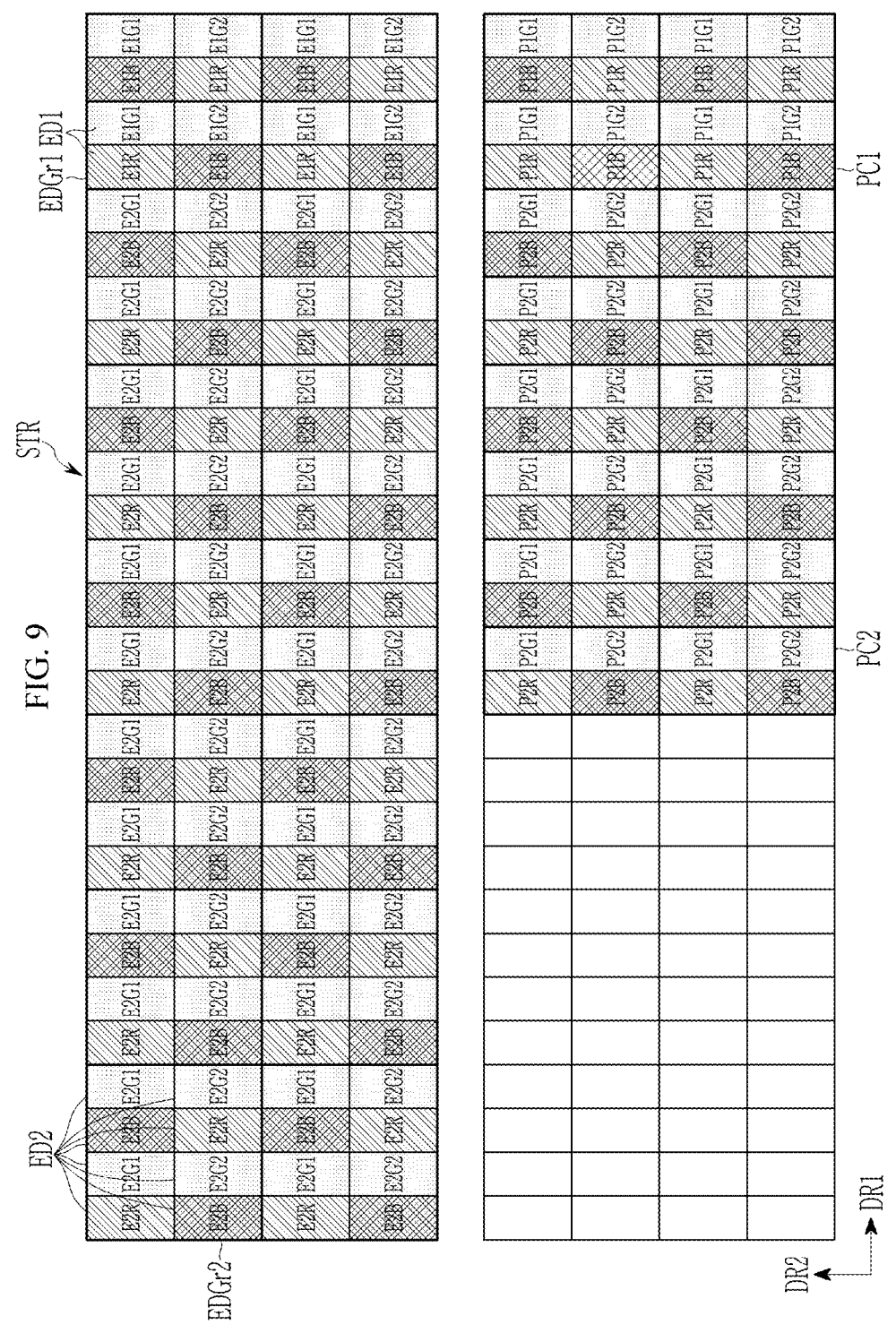
Figure 10:
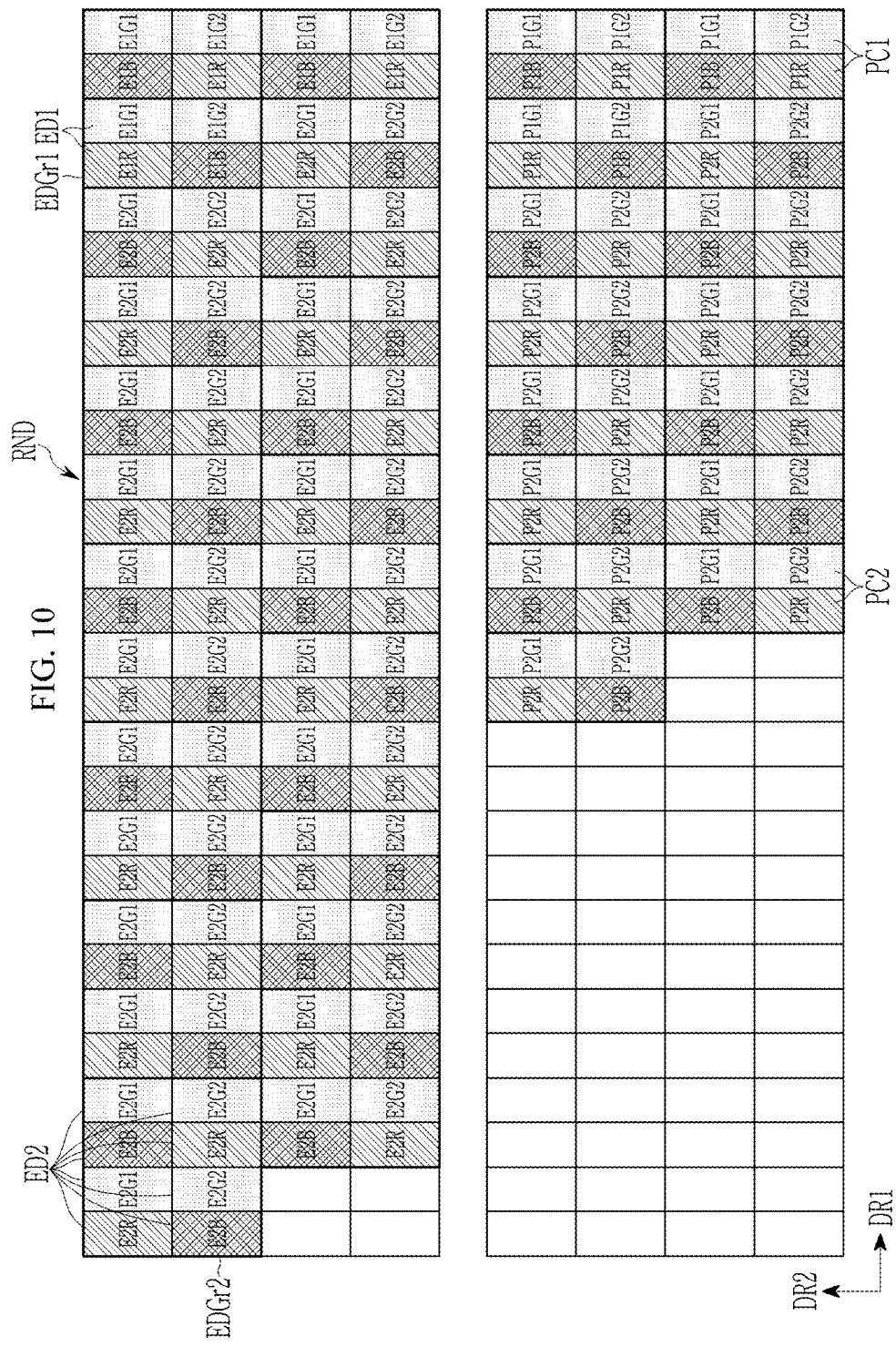

FIG. 9 and FIG. 10 show an arrangement form of the first pixel circuit portion and the second pixel circuit portion, and an arrangement form of the first light emitting element and the second light emitting element. FIG. 9 illustrates second light emitting elements ED2 positioned in a straight line portion STR (refer to FIG. 1) of the display area DA of which an edge has a straight line shape, and light emitting elements ED1 and ED2 adjacent thereto in the first direction DR1. FIG. 10 illustrates second light emitting elements ED2 positioned in a rounded portion RND (refer to FIG. 1) of the display area DA of which an edge has a rounded shape, and light emitting elements ED1 and ED2 adjacent thereto in the first direction DR1.

As shown in FIG. 9 and FIG. 10, the arrangement form of the second light emitting element ED2 positioned in the straight line portion STR (refer to FIG. 1) is different from the arrangement form of the second light emitting element ED2 positioned in the rounded portion RND (refer to FIG. 1).

Two second light emitting elements ED2 are electrically connected to one second pixel circuit portion PC2. Eight second light emitting elements ED2 adjacent to each other in the first direction DR1 and the second direction DR2 may form one second light emitting element group EDGr2. In each second light emitting element group EDGr2, the eight second light emitting elements ED2 may be arranged in a matrix format of 2×4. Second light emitting element groups EDGr2 may be disposed in a matrix format along the first direction DR1 and the second direction DR2. The second light emitting element group EDGr2 may include two first sub-light emitting elements E2R, two second sub-light emitting elements E2B, two third sub-light emitting elements E2G1, and two fourth sub-light emitting elements E2G2.

One first light emitting element ED1 is connected to one first pixel circuit portion PC1. Four second light emitting elements ED1 adjacent to each other in the first direction DR1 and the second direction DR2 may form one first light emitting element group EDGr1. First light emitting element groups EDGr1 may be disposed in a matrix format along the first direction DR1 and the second direction DR2. The first light emitting element group EDGr1 may include one first sub-light emitting element E1R, one second sub-light emitting element E1B, one third sub-light emitting element E1G1, and one fourth sub-light emitting element E1G2.

In the first row, six second light emitting element groups EDGr2 are disposed along the first direction DR1, and following the sixth second light emitting element groups EDGr2, the first light emitting element group EDGr1 is disposed along the first direction DR1. The number of second light emitting element groups EDGr2 is not limited thereto, and may be changed. In the second row, six second light emitting element groups EDGr2 are disposed along the first direction DR1, and following the sixth second light emitting element group EDGr2, the first light emitting element group EDGr1 may be disposed along the first direction DR1.

In the straight line portion STR (refer to FIG. 1), edges of second light emitting element groups EDGr2 that are adjacent to each other in the second direction DR2 are aligned. In the rounded portion RND (refer to FIG. 1), edges of second light emitting element groups EDGr2 that are adjacent to each other in the second direction DR2 may be shifted and thus they may not align. In the second row, as the second light emitting element groups EDGr2 may be shifted to the right, the number of first light emitting element groups EDGr1 may be reduced. A distance at which edges of second light emitting element groups EDGr2 that are adjacent to each other in the second direction DR2 are shifted in the rounded portion RND (refer to FIG. 1) may correspond to two widths of the second light emitting element ED2. In the second row, the number of first light emitting element groups EDGr1 may be reduced by one compared to the first row.

Hereinafter, referring to FIG. 11, an embodiment in which the arrangement relationship between the first pixel circuit portion PC1 and the second pixel circuit portion PC2 and the arrangement relationship between the first light emitting element ED1 and the second light emitting element ED2 are partially modified will be described.

Figure 11:
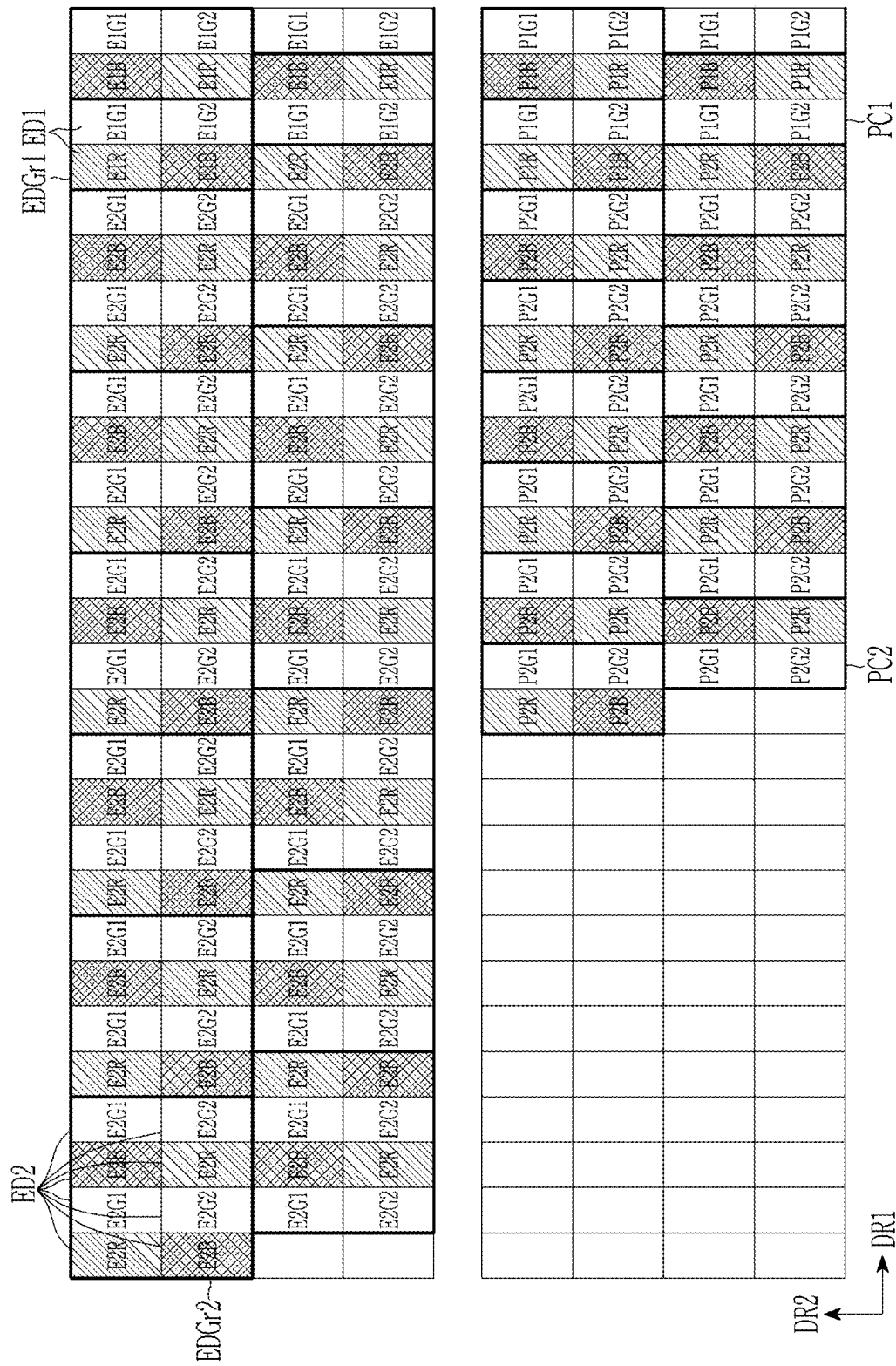
FIG. 11 show an arrangement form of the first pixel circuit portion and the second pixel circuit portion, and an arrangement form of the first light emitting element and the second light emitting element.

FIG. 11 show an arrangement form of the first pixel circuit portion and the second pixel circuit portion, and an arrangement form of the first light emitting elements ED1 and the second light emitting elements ED2. FIG. 11 illustrates second light emitting elements ED2 positioned in a rounded portion RND (refer to FIG. 1), which are rounded edges of the display area DA. Adjacent first and second light emitting elements ED1 and ED2 in the first direction DR1 are also illustrated. The light emitting elements in the straight line portion STR (refer to FIG. 1) may be disposed the same as in FIGS. 9 and 10.

As shown in FIG. 11, in the rounded portion RND (refer to FIG. 1), the edges of the second light emitting element groups EDGr2 that are adjacent to each other in the second direction DR2 may be shifted and thus they do not align. In the second row, as the second light emitting element groups EDGr2 are shifted to the right, the first light emitting element group EDGr1 may be shifted to the right. A distance at which edges of second light emitting element groups EDGr2 that are adjacent to each other in the second direction DR2 are shifted in the rounded portion RND (refer to FIG. 1) may correspond to one width of a single second light emitting element ED2.

For comparison with the display device according to the embodiments, a comparative example display device may implement a rounded portion RND (refer to FIG. 1) by reducing the number of second light emitting element groups EDGr2 positioned in the second row by one. In the comparative example, display device the second light emitting element groups EDGr2 that are adjacent to each other in the second direction DR2 are shifted four widths of a single second light emitting element ED2. As the shifted distance increases, step shape may be visible in the rounded portion RND (refer to FIG. 1), and the edge may not appear as a smooth curved line. The display device according to the embodiments may prevent such a step shape from being visible in the rounded portion RND (refer to FIG. 1) by reducing the shift distance. The edge of the display device may be implemented as a smooth curved line.

Figure 12:
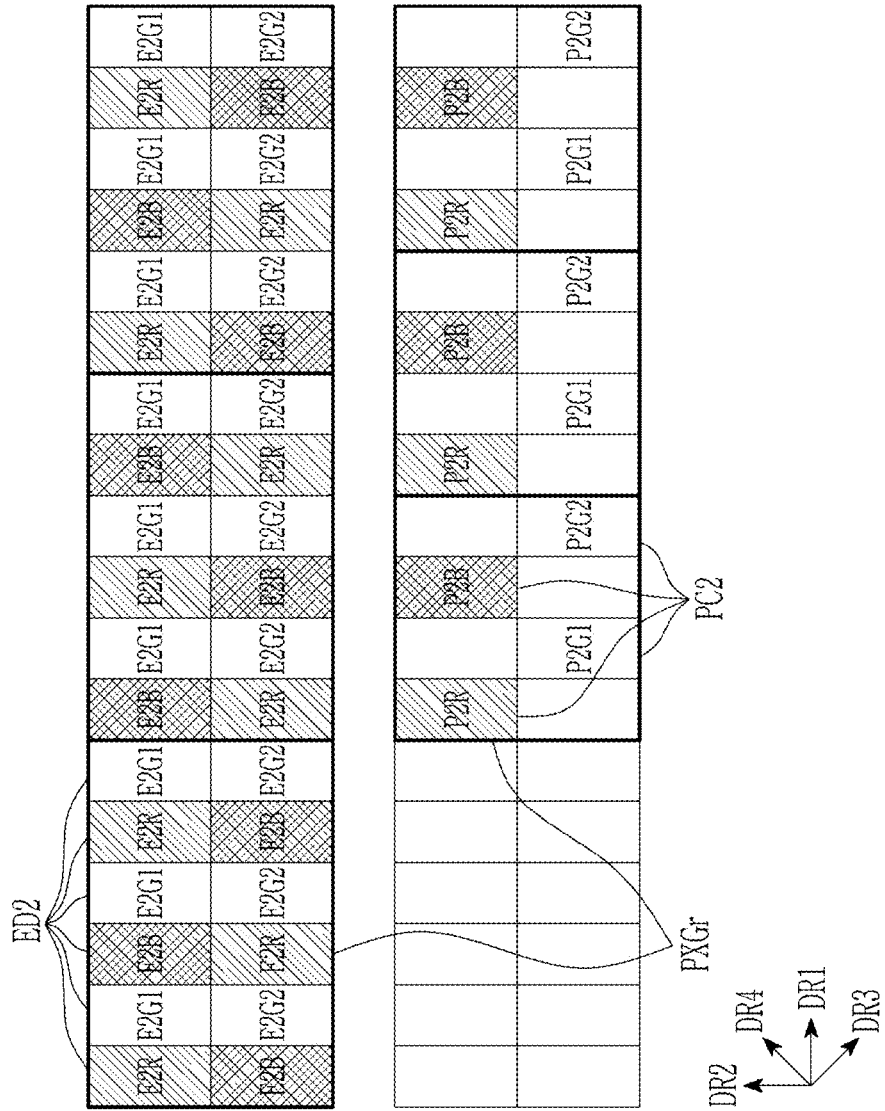
FIG. 12 shows an arrangement form of the second pixel circuit portion of the display device and an arrangement form of the second light emitting element, respectively, according to an embodiment.
Figure 13:
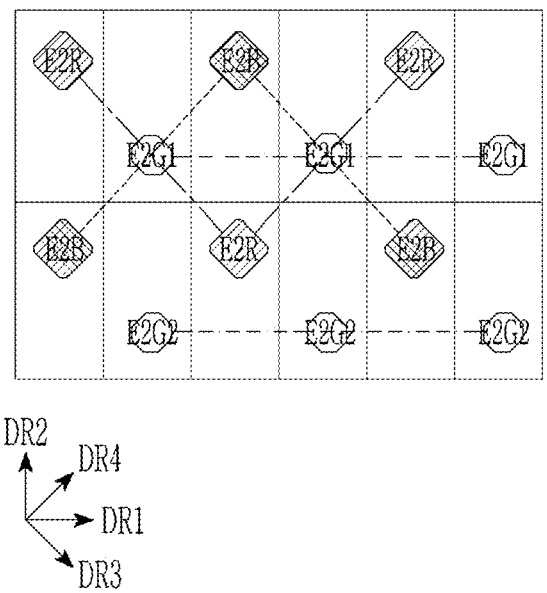
FIG. 13 shows a connection of the second light emitting elements of the display device according to the embodiment.

Referring to FIG. 12 and FIG. 13, in an embodiment, each second pixel circuit portion PC2 may be connected to three second light emitting elements ED2. The arrangement form of the second pixel circuit portion PC2 and the second light emitting elements ED2, and their electrical connections will be described.

FIG. 12 shows an arrangement form of the second pixel circuit portion of the display device and an arrangement form of the second light emitting element, respectively, according to an embodiment. In FIG. 12, for convenience of description, the second pixel circuit portion PC2 and the second light emitting element ED2 are illustrated separately, but the second pixel circuit portion PC2 may overlap some of the second light emitting elements ED2 in a plan view. FIG. 13 illustrates an electrical connection of the second light emitting elements ED2 of the display device according to the embodiment.

As shown in FIG. 12 and FIG. 13, second light emitting elements ED2 may be disposed along a first direction DR1 and a second direction DR2 on a second display area of a substrate of the display device according to the embodiment. Second pixel circuit portions PC2 may be disposed in a zigzag form on the second display area of the substrate of the display device according to the embodiment. Second pixel circuit portions PC2 disposed along the first direction DR1 may be electrically connected to the same scan line. Although not shown, second pixel circuit portions PC2 may be disposed along the second direction DR2, and may be electrically connected to the same data line.

The second light emitting element ED2 may include a first sub-light emitting element E2R, a second sub-light emitting element E2B, a third sub-light emitting element E2G1, and a fourth sub-light emitting element E2G2. Each of the first sub-light emitting element E2R, the second sub-light emitting element E2B, the third sub-light emitting element E2G1, and the fourth sub-light emitting element E2G2 may emit light of a selected color. For example, the first sub-light emitting element E2R may emit red light, and the second sub-light emitting element E2B may emit blue light. The third sub-light emitting element E2G1 and the fourth sub-light emitting element E2G2 may emit green light. In a first row, the first sub-light emitting element E2R, the third sub-light emitting element E2G1, the second sub-light emitting element E2B, and the third sub-light emitting element E2G1 may be sequentially disposed along the first direction DR1. In a second row, the second sub-light emitting element E2B, the fourth sub-light emitting element E2G2, the first sub-light emitting element E2R, and the fourth sub-light emitting element E2G2 may be sequentially disposed along the first direction DR1. The first sub-light emitting element E2R and the second sub-light emitting element E2B may be adjacent in the second direction DR2, and the third sub-light emitting element E2G1 and the fourth sub-light emitting element E2G2 may be adjacent in the second direction DR2.

The second pixel circuit portion PC2 may include a first sub-pixel circuit portion P2R, a second sub-pixel circuit portion P2B, a third sub-pixel circuit portion P2G1, and a fourth sub-pixel circuit portion P2G2. The first sub-pixel circuit portion P2R may be electrically connected to three first sub-light emitting elements E2R. The second sub-pixel circuit portion P2B may be electrically connected to three second sub-light emitting elements E2B. The third sub-pixel circuit portion P2G1 may be electrically connected to three third sub-light emitting elements E2G1. The fourth sub-pixel circuit portion P2G2 may be electrically connected to three fourth sub-light emitting elements E2G2. The second pixel circuit portion PC2 may not overlap its electrically connected second light emitting element ED2. The second pixel circuit portion PC2 may overlap, in a plan view, a second light emitting element ED2 to which it is not electrically connected. The first sub-pixel circuit portion P2R and the second sub-pixel circuit portion P2B may be adjacent in the first direction DR1, and the third sub-pixel circuit portion P2G1 and the fourth sub-pixel circuit portion P2G2 may be adjacent in the first direction DR1. The first sub-pixel circuit portion P2R and the third sub-pixel circuit portion P2G1 may be adjacent in the third direction DR3, and the second sub-pixel circuit portion P2B and the fourth sub-pixel circuit portion P2G2 may be adjacent in the third direction DR3. The first sub-pixel circuit portion P2R, the third sub-pixel circuit portion P2G1, the second sub-pixel circuit portion P2B, and the fourth sub-pixel circuit portion P2G2 may be disposed in a zigzag form. In the embodiment, since an area occupied by the second pixel circuit portion PC2 can be designed to have a wider area than in other examples, sufficient capacitance can be provided.

The three first sub-light emitting elements E2R electrically connected to the first sub-pixel circuit portion P2R may be positioned at each vertex of a triangle.

Each of the sides of the imaginary triangle may be parallel to the first direction DR1, the third direction DR3, and the fourth direction DR4. The adjacent three first sub-light emitting elements E2R may be electrically connected to each other to receive the same signal and exhibit the same luminance. The three second sub-light emitting elements E2B electrically connected to the second sub-pixel circuit portion P2B may be positioned at each vertex of the imaginary triangle. Each side of the imaginary triangle may be parallel to the first direction DR1, the third direction DR3, and the fourth direction DR4. The adjacent three second sub-light emitting elements E2B may be electrically connected to each other to receive the same signal and exhibit the same luminance. The third sub-light emitting element E2G1 electrically connected to the third sub-pixel circuit portion P2G1 may be disposed along the first direction DR1. For example, the three third sub-light emitting elements E2G1 adjacent along the first direction DR1 are electrically connected to each other to receive the same signal and exhibit the same luminance. Three fourth sub-light emitting elements E2G2 electrically connected to the fourth sub-pixel circuit portion P2G2 may be disposed along the first direction DR1. The three fourth sub-light emitting elements E2G2 adjacent along the first direction DR1 may be electrically connected to each other to receive the same signal and exhibit the same luminance.

Four sub-pixel circuit portions P2R, P2B, P2G1, and P2G2 and twelve sub-light emitting elements E2R, E2B, E2G1, and E2G2 may form one pixel group PXGr. Pixel groups PXGr may be repeatedly disposed in the second display area. The second pixel circuit portion PC2 of a first pixel group PXGr positioned at the leftmost side may be electrically connected to second light emitting elements ED2 of the first pixel group PXGr. In a plan view, the second pixel circuit portion PC2 of the first pixel group PXGr may not overlap the second light emitting elements ED2 of the first pixel group PXGr. The second pixel circuit portion PC2 of the first pixel group PXGr may overlap at least a portion of the second light emitting element ED2 of the second pixel group PXGr. A second pixel circuit portion PC2 of a second pixel group PXGr may overlap at least a portion of a second light emitting element ED2 of a third pixel group PXGr. A second pixel circuit portion PC2 of a third pixel group PXGr may overlap at least a portion of the second light emitting element ED2 of the third pixel group PXGr, and may overlap at least a part of a second light emitting element ED2 of a fourth pixel group PXGr. A second pixel circuit portion PC2 of the fourth pixel group PXGr may overlap at least a portion of the second light emitting element ED2 of the fourth pixel group PXGr, in a plan view.

Hereinafter, referring to FIG. 14 and FIG. 15, an arrangement relationship between the first pixel circuit portion PC1 and the second pixel circuit portion PC2 and an arrangement relationship between the first light emitting element ED1 and the second light emitting element ED2 will be described.

Figure 14:
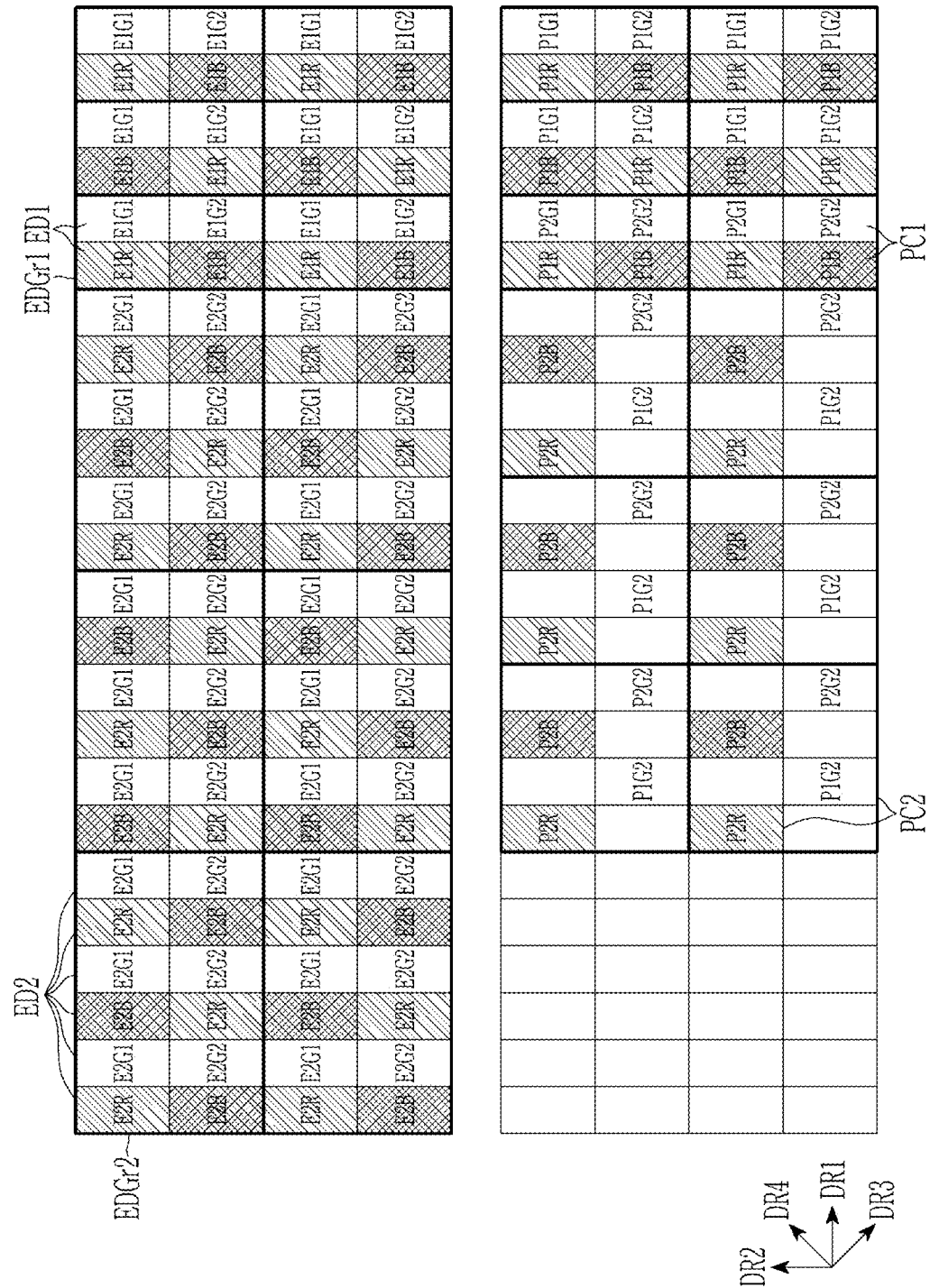
FIG. 14 and FIG. 15 show an arrangement form of the first pixel circuit portion and the second pixel circuit portion and an arrangement form of the first light emitting element and the second light emitting element.
Figure 15:
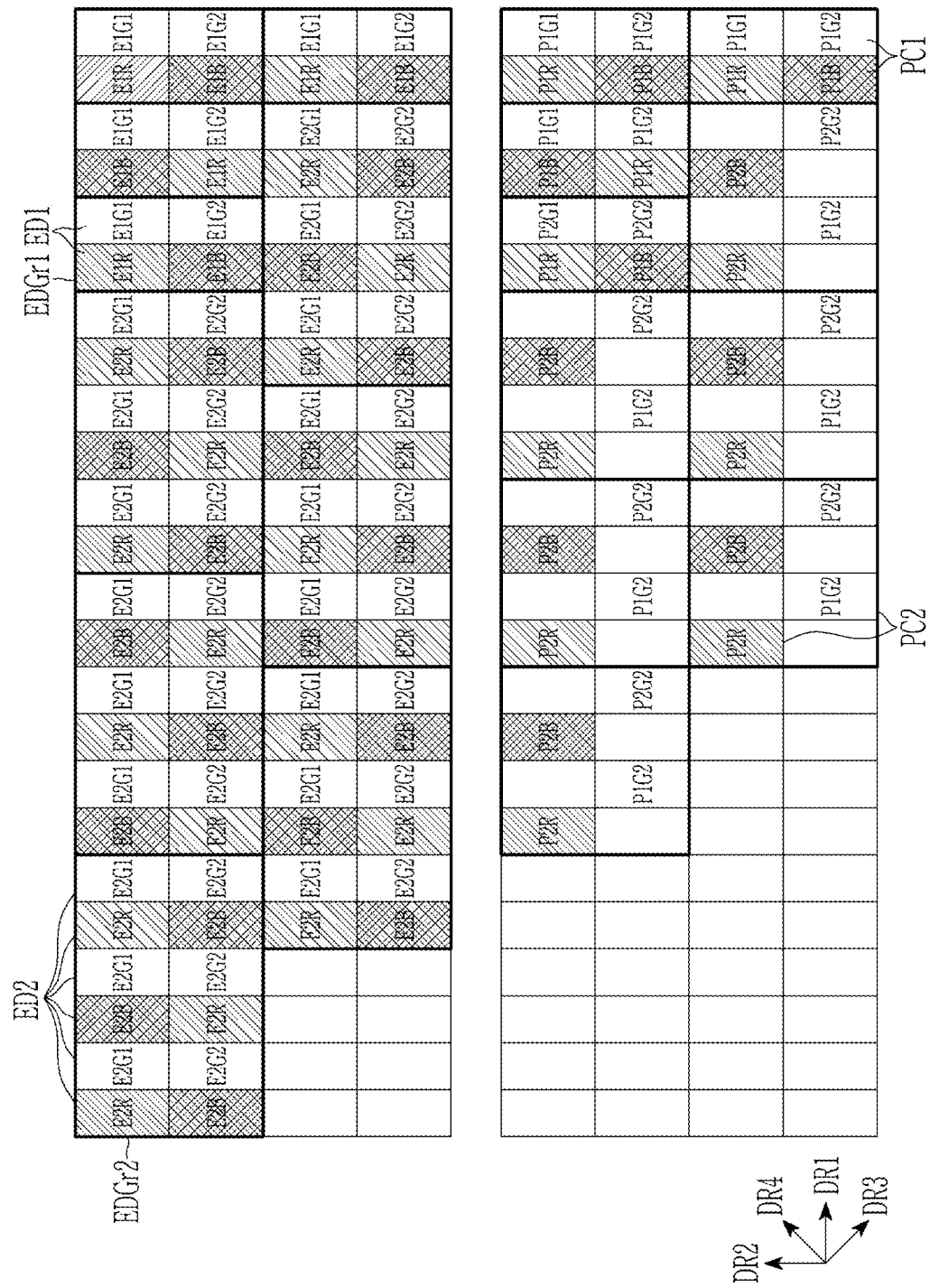

FIG. 14 and FIG. 15 show an arrangement form of the first pixel circuit portion and the second pixel circuit portion and an arrangement form of the first light emitting elements ED1 and the second light emitting elements ED2. FIG. 14 shows second light emitting elements ED2 positioned in a straight line portion STR (refer to FIG. 1) of the display area DA of which an edge has a straight line shape, and light emitting elements ED1 and ED2 adjacent thereto in the first direction DR1. FIG. 15 shows second light emitting elements ED2 positioned in a rounded portion RND (refer to FIG. 1) of the display area DA of which an edge has a rounded shape, and first and second light emitting elements ED1 and ED2 adjacent to the rounded portion RND (refer to FIG. 1) in the first direction DR1.

As shown in FIG. 14 and FIG. 15, the arrangement form of the second light emitting element ED2 positioned in the straight line portion STR (refer to FIG. 1) may be different from the arrangement form of the second light emitting element ED2 positioned in the rounded portion RND (refer to FIG. 1).

Three second light emitting elements ED2 are connected to one second pixel circuit portion PC2. Twelve second light emitting elements ED2 adjacent to each other in the first direction DR1 and the second direction DR2 may form one second light emitting element group EDGr2. In each second light emitting element group EDGr2, the twelve second light emitting elements ED2 may be arranged in a matrix format of 2×6. Second light emitting element groups EDGr2 may be disposed in a matrix format along the first direction DR1 and the second direction DR2. The second light emitting element group EDGr2 may include three first sub-light emitting elements E2R, three second sub-light emitting elements E2B, three third sub-light emitting elements E2G1, and three fourth sub-light emitting elements E2G2.

One first light emitting element ED1 is connected to one first pixel circuit portion PC1. Four second light emitting elements ED1 adjacent to each other in the first direction DR1 and the second direction DR2 may form one first light emitting element group EDGr1. The first light emitting element groups EDGr1 may be disposed in a matrix format along the first direction DR1 and the second direction DR2. The first light emitting element group EDGr1 may include one first sub-light emitting element E1R, one second sub-light emitting element E1B, one third sub-light emitting element E1G1, and one fourth sub-light emitting element E1G2.

In the first row, three second light emitting element groups EDGr2 are disposed along the first direction DR1, and following third second light emitting element groups EDGr2, the first light emitting element group EDGr1 is disposed along the first direction DR1. The number of second light emitting element groups EDGr2 is not limited thereto, and may be changed. In the second row, three second light emitting element groups EDGr2 are disposed along the first direction DR1, and following the third second light emitting element group (EDGr2), the first light emitting element group EDGr1 may be disposed along the first direction DR1.

In the straight line portion STR (refer to FIG. 1), edges of second light emitting element groups EDGr2 that are adjacent to each other in the second direction DR2 are aligned. In the rounded portion RND (refer to FIG. 1), edges of second light emitting element groups EDGr2 that are adjacent to each other in the second direction DR2 are shifted and thus the edges do not align. In the second row, as the second light emitting element groups EDGr2 are shifted to the right, the number of first light emitting element groups EDGr1 may be reduced. A distance at which edges of adjacent second light emitting element groups EDGr2 are shifted in the rounded portion RND (refer to FIG. 1) may correspond to four widths of the second light emitting element ED2. In the second row, the number of first light emitting element groups EDGr1 is reduced by one compared to the first row.

Figure 16:
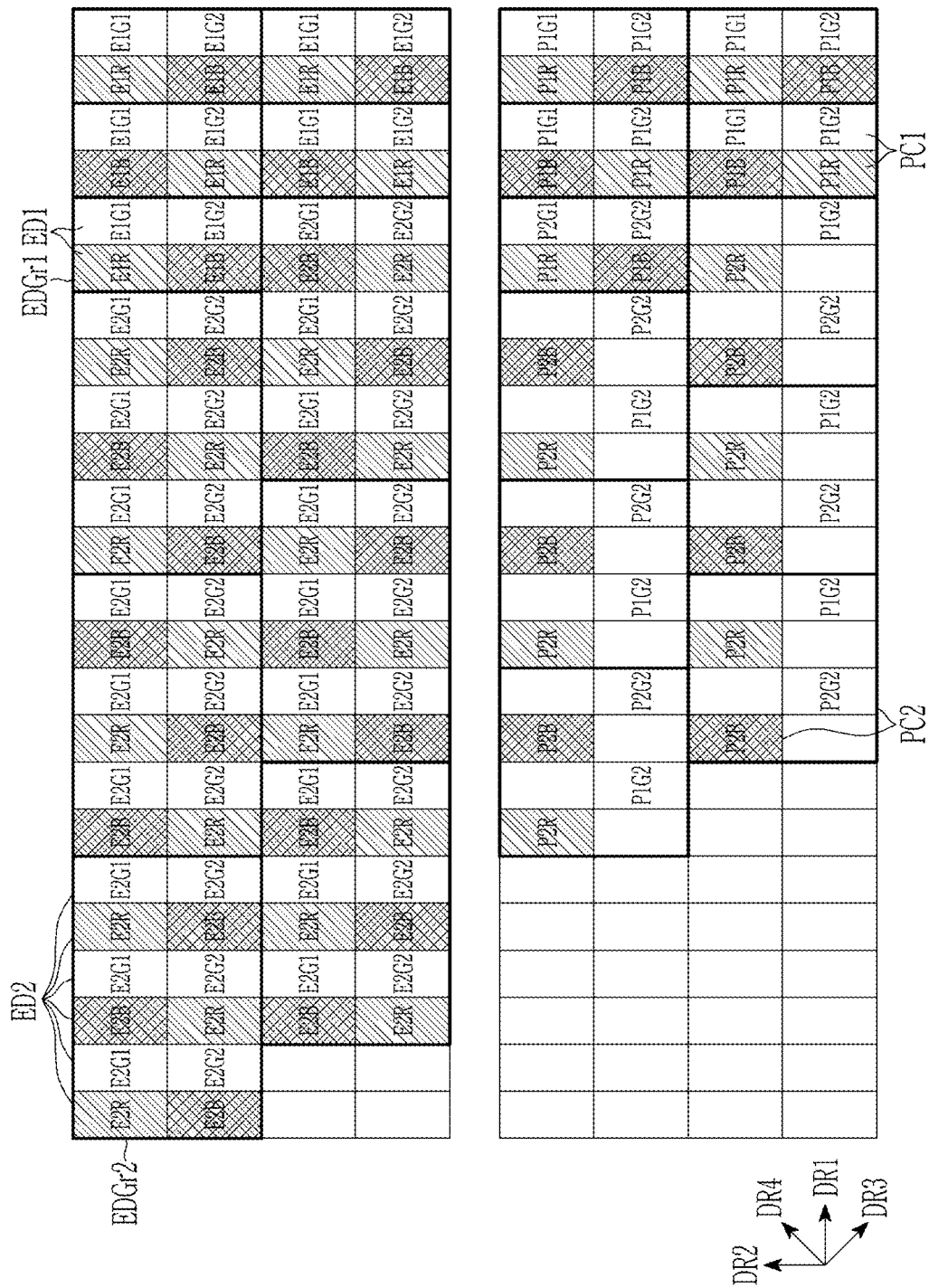
FIG. 16 show an arrangement form of the first pixel circuit portion and the second pixel circuit portion and an arrangement form of the first light emitting element and the second light emitting element.

Referring to FIG. 16, in other embodiments, the arrangement of the first pixel circuit portion PC1 and the second pixel circuit portion PC2 and the arrangement of the first light emitting elements ED1 and the second light emitting elements ED2 may be modified.

FIG. 16 shows an arrangement form of the first pixel circuit portion and the second pixel circuit portion and an arrangement form of the first light emitting elements ED1 and the second light emitting elements ED2. FIG. 16 illustrates second light emitting elements ED2 positioned in the rounded portions RND (refer to FIG. 1), which are the rounded edges of the display area DA. The light emitting elements ED1 and ED2 are disposed adjacent to the rounded edge of the display area in the first direction DR1. The first and second light emitting elements ED1 and ED2 disposed in the straight line portion STR (refer to FIG. 1) are arranged similarly as the previous examples.

As shown in FIG. 16, in the rounded portion RND (refer to FIG. 1), the edges of the second light emitting element groups EDGr2 that are adjacent to each other in the second direction DR2 are shifted and thus they are not aligned. In the second row, as the second light emitting element groups EDGr2 are shifted to the right, the first light emitting element group EDGr1 may be shifted to the right. The second light emitting element groups EDGr2 that are adjacent to each other in the second direction may be shifted by two widths of the second light emitting element ED2 in the rounded portion RND (refer to FIG. 1). In the second row, the number of first light emitting element groups EDGr1 is reduced by one compared to the first row.

Compared to a display device according to an embodiment, a comparative example display device may implement the rounded portion RND (refer to FIG. 1) by removing an entire second light emitting element group EDGr2 from the second row. In the comparative example, the distance the edges of adjacent second light emitting element groups EDGr2 adjacent to each other in the second direction are shifted corresponds to six widths of a single second light emitting element ED2. As the shift distance increases, a step shape may become visible in the rounded portion RND (refer to FIG. 1), and the edge may not be implemented as a smooth curved line. In the embodiment, it is possible to prevent the rounded portion RND (refer to FIG. 1) from becoming a step shape by reducing the shift distance, and the edge can be implemented as a smooth curved line.

Figure 17:
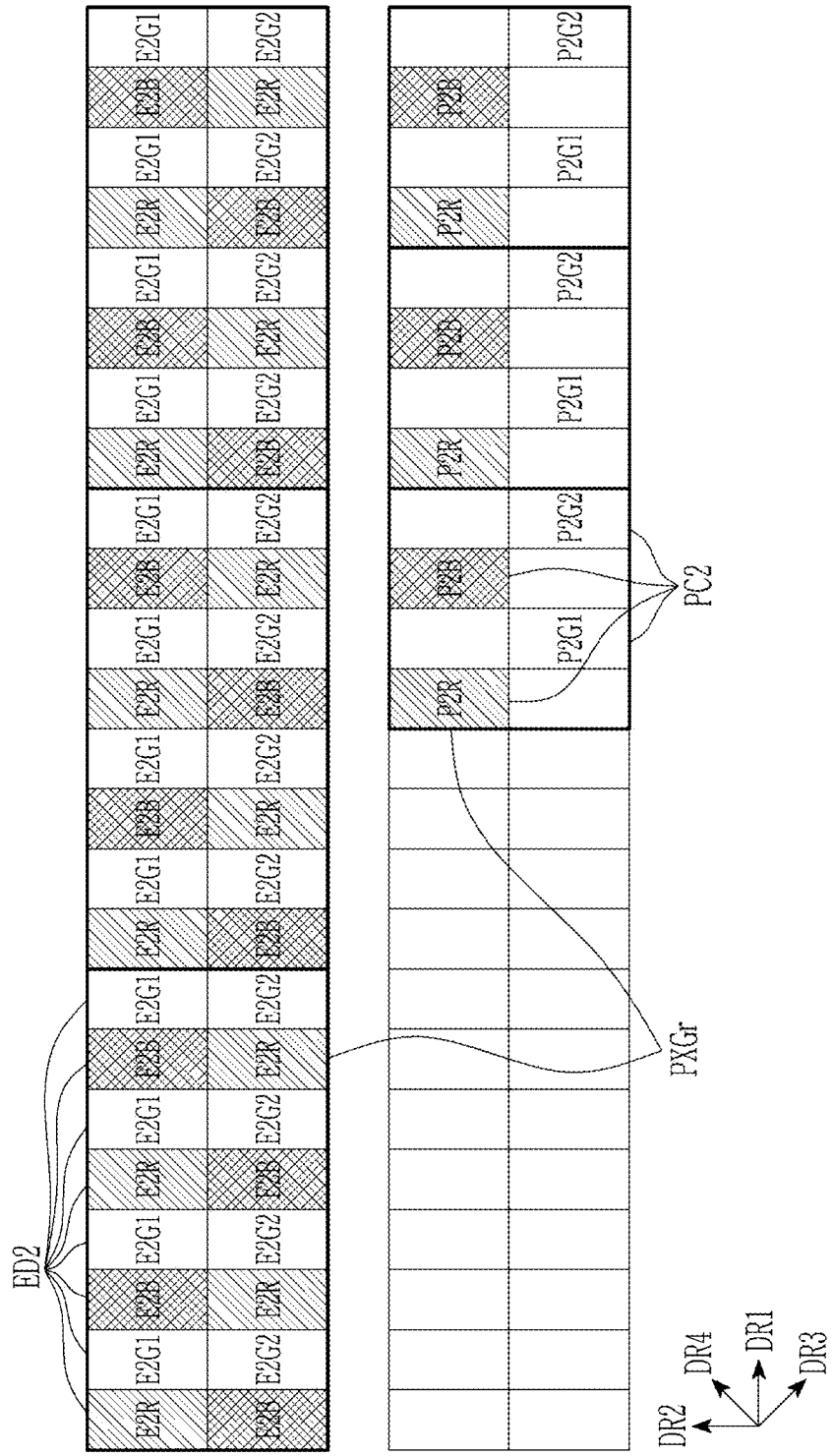
FIG. 17 shows an arrangement form of the second pixel circuit portion of the display device and an arrangement form of the second light emitting element, respectively, according to an embodiment.
Figure 18:
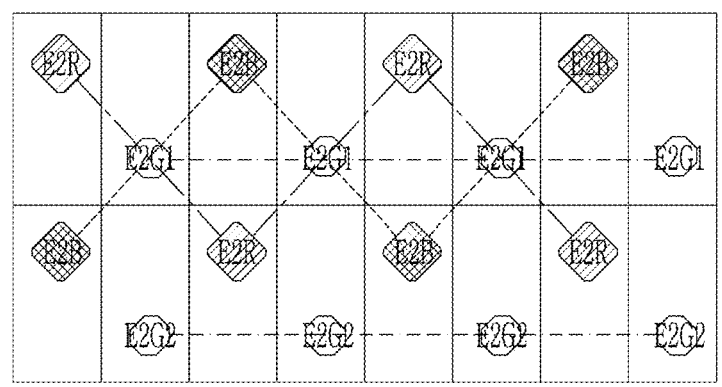
FIG. 18 shows a connection of the second light emitting elements of the display device according to the embodiment.
Figure 18:
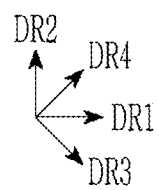

Referring to the embodiments of FIG. 17 and FIG. 18, each second pixel circuit portion PC2 may be connected to four second light emitting elements ED2. The arrangement form of the second pixel circuit portion PC2 and the second light emitting element ED2, and the electrical connections of the second light emitting element ED2 are illustrated.

FIG. 17 shows an arrangement form of the second pixel circuit portion of the display device and an arrangement form of the second light emitting element, respectively, according to an embodiment. In FIG. 17, for convenience of description, the second pixel circuit portion PC2 and the second light emitting element ED2 are illustrated separately, but the second pixel circuit portion PC2 may overlap some of the second light emitting elements ED2 in a plan view. FIG. 18 shows the electrical connections of the second light emitting elements of the display device according to the embodiment.

As shown in FIG. 17 and FIG. 18, second light emitting elements ED2 may be disposed along a first direction DR1 and a second direction DR2 on a second display area of a substrate of the display device according to the embodiment. Second pixel circuit portions PC2 may be disposed in a zigzag form on the second display area of the substrate of the display device according to the embodiment. Second pixel circuit portions PC2 disposed along the first direction DR1 may be electrically connected to the same scan line. Although not shown, second pixel circuit portions PC2 may be disposed along the second direction DR2, and they may be electrically connected to the same data line.

The second light emitting element ED2 may include a first sub-light emitting element E2R, a second sub-light emitting element E2B, a third sub-light emitting element E2G1, and a fourth sub-light emitting element E2G2. Each of the first sub-light emitting element E2R, the second sub-light emitting element E2B, the third sub-light emitting element E2G1, and the fourth sub-light emitting element E2G2 may emit light of a selected color. For example, the first sub-light emitting element E2R may emit red light, and the second sub-light emitting element E2B may emit blue light. The third sub-light emitting element E2G1 and the fourth sub-light emitting element E2G2 may emit green light. In a first row, the first sub-light emitting element E2R, the third sub-light emitting element E2G1, the second sub-light emitting element E2B, and the third sub-light emitting element E2G1 may be sequentially disposed along the first direction DR1. In a second row, the second sub-light emitting element E2B, the fourth sub-light emitting element E2G2, the first sub-light emitting element E2R, and the fourth sub-light emitting element E2G2 may be sequentially disposed along the first direction DR1. The first sub-light emitting element E2R and the second sub-light emitting element E2B may be adjacent in the second direction DR2, and the third sub-light emitting element E2G1 and the fourth sub-light emitting element E2G2 may be adjacent in the second direction DR2.

The second pixel circuit portion PC2 may include a first sub-pixel circuit portion P2R, a second sub-pixel circuit portion P2B, a third sub-pixel circuit portion P2G1, and a fourth sub-pixel circuit portion P2G2. The first sub-pixel circuit portion P2R may be electrically connected to four first sub-light emitting elements E2R. The second sub-pixel circuit portion P2B may be electrically connected to four second sub-light emitting elements E2B. The third sub-pixel circuit portion P2G1 may be electrically connected to four third sub-light emitting elements E2G1. The fourth sub-pixel circuit portion P2G2 may be electrically connected to four fourth sub-light emitting elements E2G2. The second pixel circuit portion PC2 may not overlap the electrically connected second light emitting elements ED2. The second pixel circuit portion PC2 may overlap other second light emitting elements ED2 that are not connected to the second pixel circuit portion PC2. The first sub-pixel circuit portion P2R and the second sub-pixel circuit portion P2B may be adjacent in the first direction DR1, and the third sub-pixel circuit portion P2G1 and the fourth sub-pixel circuit portion P2G2 may be adjacent in the first direction DR1. The first sub-pixel circuit portion P2R and the third sub-pixel circuit portion P2G1 may be adjacent in the third direction DR3, and the second sub-pixel circuit portion P2B and the fourth sub-pixel circuit portion P2G2 may be adjacent in the third direction DR3. The first sub-pixel circuit portion P2R, the third sub-pixel circuit portion P2G1, the second sub-pixel circuit portion P2B, and the fourth sub-pixel circuit portion P2G2 may be disposed in a zigzag form. In the embodiment, since an area occupied by the second pixel circuit portion PC2 can be designed to be wider than in previous examples, sufficient capacitance can be provided.

Four first sub-light emitting elements E2R electrically connected to the first sub-pixel circuit portion P2R may be disposed in a zigzag form. The four first sub-light emitting elements E2R may be electrically connected to each other along the third direction DR3 and the fourth direction DR4 to receive the same signal and exhibit the same luminance. The four second sub-light emitting elements E2B electrically connected to the second sub-pixel circuit portion P2B may be disposed in a zigzag form. The four second sub-light emitting elements E2B may be electrically connected to each other along the fourth direction DR4 and the third direction DR3 to receive the same signal and exhibit the same luminance. The fourth third sub-light emitting elements E2G1 electrically connected to the third sub-pixel circuit portion P2G1 may be disposed along the first direction DR1. The four third sub-light emitting elements E2G1 adjacent along the first direction DR1 are electrically connected to each other to receive the same signal and exhibit the same luminance. The fourth sub-light emitting elements E2G2 electrically connected to the fourth sub-pixel circuit portion P2G2 may be disposed along the first direction DR1. The four fourth sub-light emitting elements E2G2 adjacent along the first direction DR1 may be electrically connected to each other to receive the same signal and may exhibit the same luminance.

Four sub-pixel circuit portions P2R, P2B, P2G1, and P2G2 and sixteen sub-light emitting elements E2R, E2B, E2G1, and E2G2 may form one pixel group PXGr. Pixel groups PXGr may be repeatedly disposed in the second display area. The second pixel circuit portion PC2 of a first pixel group PXGr positioned at the leftmost side may be electrically connected to a second light emitting element ED2 of the first pixel group PXGr. In a plan view, the second pixel circuit portion PC2 of the first pixel group PXGr may not overlap the second light emitting element ED2 of the first pixel group PXGr. The second pixel circuit portion PC2 of the first pixel group PXGr may overlap at least a portion of the second light emitting element ED2 of the second pixel group PXGr, in a plan view. A second pixel circuit portion PC2 of a second pixel group PXGr may overlap at least a portion of a second light emitting element ED2 of a third pixel group PXGr, in a plan view.

Figure 19:
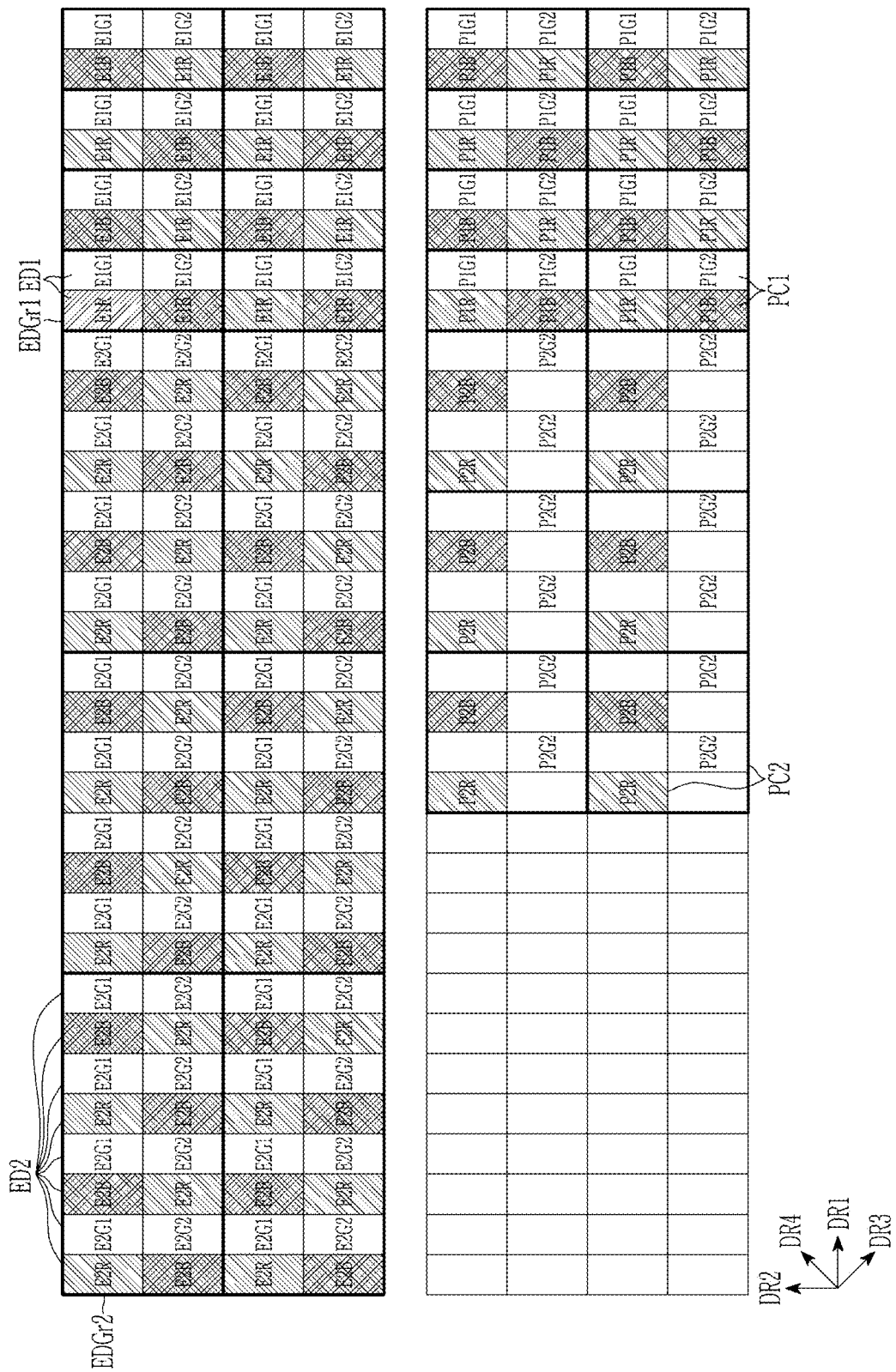
FIG. 19 and FIG. 20 show an arrangement form of the first pixel circuit portion and the second pixel circuit portion and an arrangement form of the first light emitting element and the second light emitting element.
Figure 20:
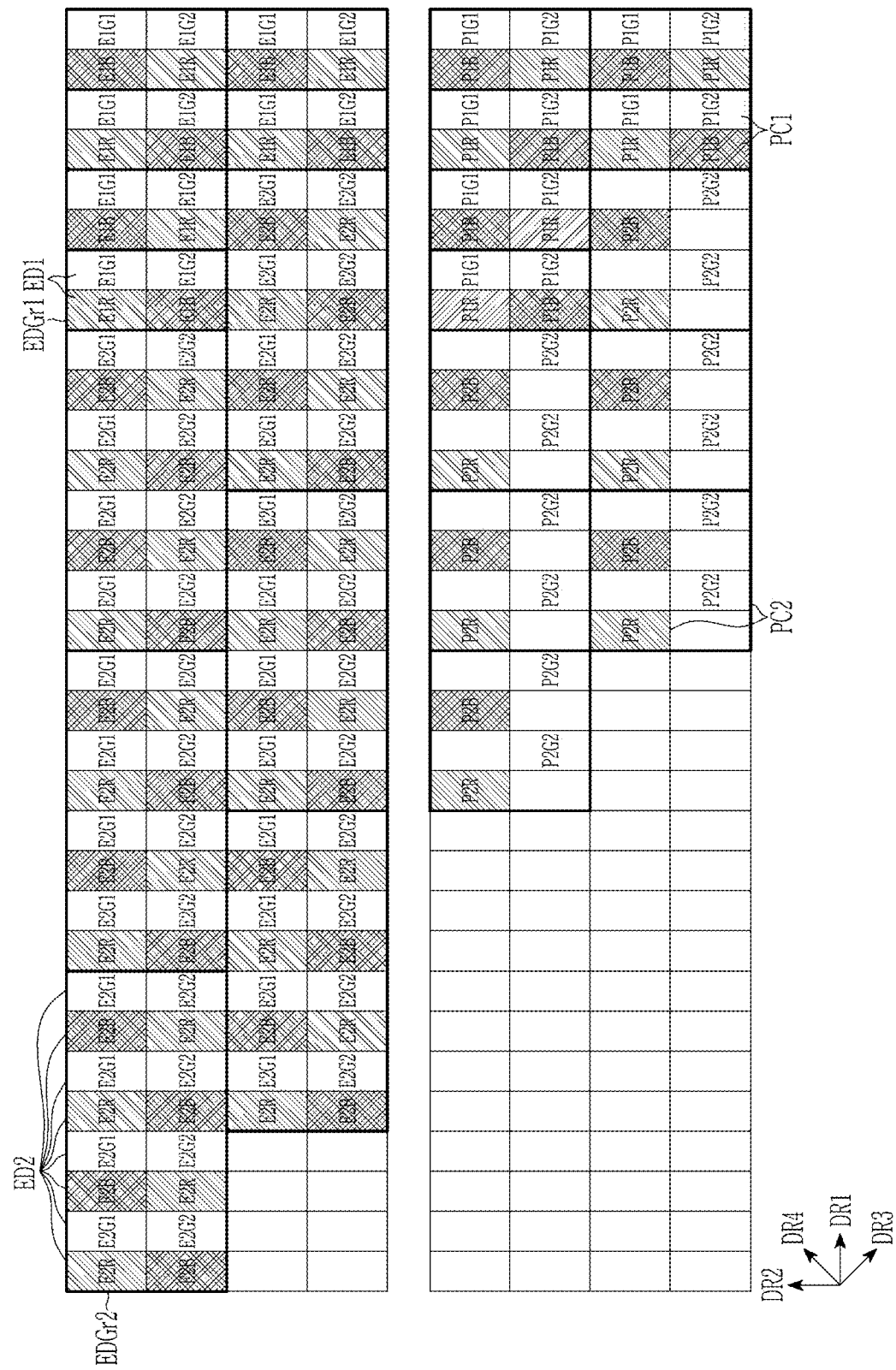

Referring to FIG. 19 and FIG. 20, an arrangement of the first pixel circuit portion PC1 and the second pixel circuit portion PC2, and an arrangement of the first light emitting element ED1 and the second light emitting element ED2 according to an embodiment will be described.

FIG. 19 and FIG. 20 show an arrangement form of the first pixel circuit portion and the second pixel circuit portion and an arrangement form of the first light emitting element and the second light emitting element. FIG. 19 shows second light emitting elements ED2 positioned in a straight line portion STR (refer to FIG. 1) of the edge of the display area DA which has a straight line shape, and first and second light emitting elements ED1 and ED2 adjacent to the straight line portion STR (refer to FIG. 1) in the first direction DR1. FIG. 20 shows second light emitting elements ED2 positioned in a rounded portion RND (refer to FIG. 1) of the edge of the display area DA which has a rounded shape, and light emitting elements ED1 and ED2 adjacent to the rounded portion RND (refer to FIG. 1) in the first direction DR1.

As shown in FIG. 19 and FIG. 20, the arrangement form of the second light emitting element ED2 positioned in the straight line portion STR (refer to FIG. 1) is different from the arrangement form of the second light emitting element ED2 positioned in the rounded portion RND (refer to FIG. 1).

Four second light emitting elements ED2 are connected to one second pixel circuit portion PC2. Sixteen second light emitting elements ED2 adjacent to each other in the first direction DR1 and the second direction DR2 may form one second light emitting element group EDGr2. In each second light emitting element group EDGr2, the sixteen second light emitting elements ED2 may be arranged in a matrix format of 2×8. Second light emitting element groups EDGr2 may be disposed in a matrix format along the first direction DR1 and the second direction DR2. The second light emitting element group EDGr2 may include four first sub-light emitting elements E2R, four second sub-light emitting elements E2B, four third sub-light emitting elements E2G1, and four fourth sub-light emitting elements E2G2.

One first light emitting element ED1 is connected to one first pixel circuit portion PC1. Four second light emitting elements ED1 adjacent to each other in the first direction DR1 and the second direction DR2 may form one first light emitting element group EDGr1. First light emitting element groups EDGr1 may be disposed in a matrix format along the first direction DR1 and the second direction DR2. The first light emitting element group EDGr1 may include one first sub-light emitting element E1R, one second sub-light emitting element E1B, one third sub-light emitting element E1G1, and one fourth sub-light emitting element E1G2.

In the first row, three second light emitting element groups EDGr2 are disposed along the first direction DR1, and following third second light emitting element groups EDGr2, the first light emitting element group EDGr1 is disposed along the first direction DR1. The number of second light emitting element groups EDGr2 is not limited thereto, and may be changed. In the second row, three second light emitting element groups EDGr2 are disposed along the first direction DR1, and following the third second light emitting element group (EDGr2), the first light emitting element group EDGr1 may be disposed along the first direction DR1.

In the straight line portion STR (refer to FIG. 1), edges of adjacent second light emitting element groups EDGr2 are aligned in the second direction DR2. In the rounded portion RND (refer to FIG. 1), edges of second light emitting element groups EDGr2 that are adjacent to each other in the second direction DR2 may be shifted and thus are not aligned. In the second row, as the second light emitting element groups EDGr2 are shifted to the right, the number of first light emitting element groups EDGr1 may be reduced. A distance at which edges of second light emitting element groups EDGr2 that are adjacent to each other in the second direction may be shifted in the rounded portion RND (refer to FIG. 1) may correspond to four widths of the second light emitting element ED2. In the second row, the number of first light emitting element groups EDGr1 is reduced by one compared to the first row.

Figure 21:
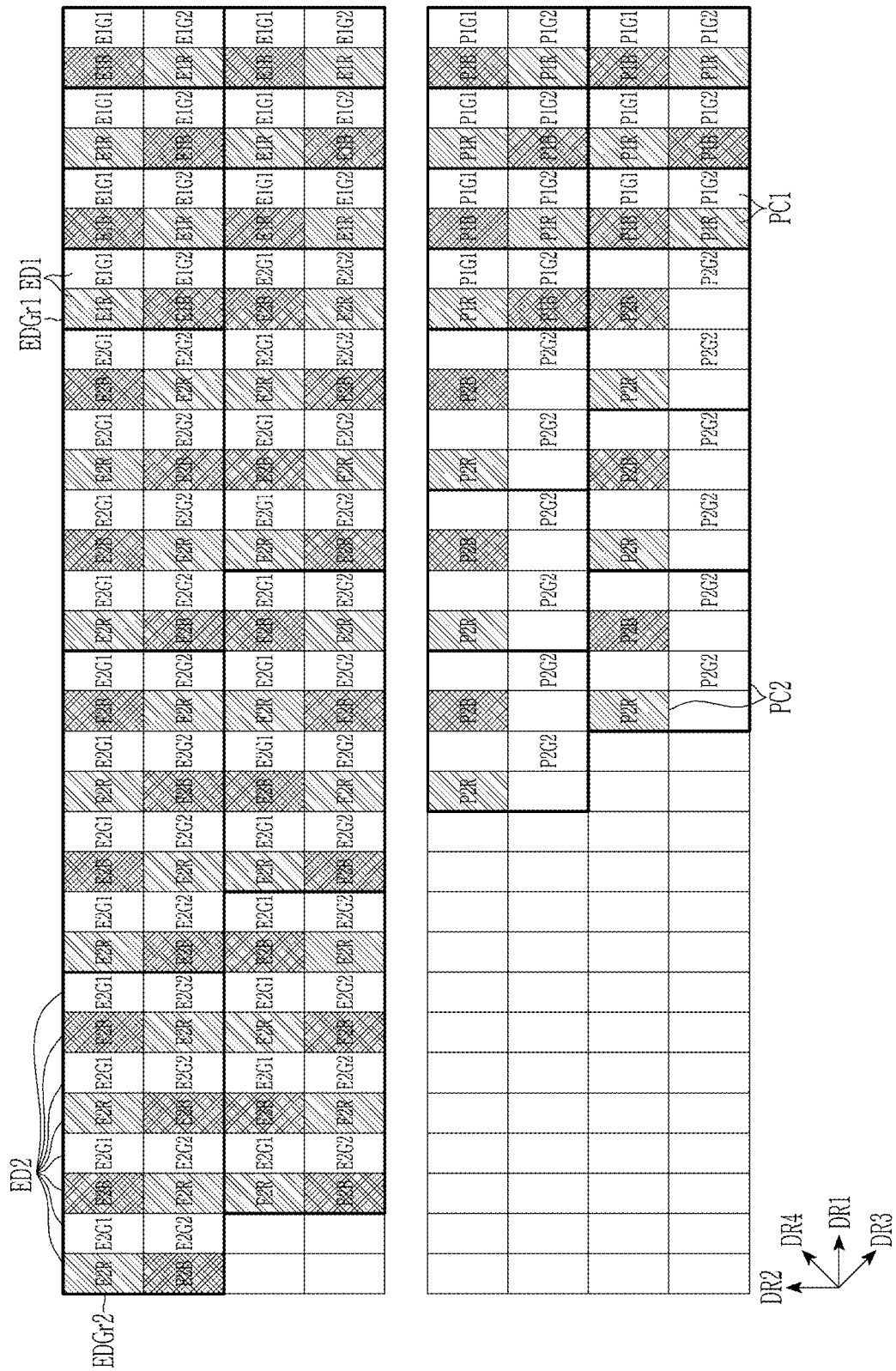
FIG. 21 show an arrangement form of the first pixel circuit portion and the second pixel circuit portion and an arrangement form of the first light emitting element and the second light emitting element.

Referring to FIG. 21, in other embodiments, the arrangement of the first pixel circuit portion PC1 and the second pixel circuit portion PC2, and the arrangement of the first light emitting elements ED1 and the second light emitting elements ED2 may be partially modified.

FIG. 21 shows an arrangement form of the first pixel circuit portion and the second pixel circuit portion and an arrangement form of the first light emitting elements ED1 and the second light emitting elements ED2. FIG. 21 illustrates second light emitting elements ED2 positioned in the rounded portions RND (refer to FIG. 1), which are the rounded edges of the display area DA. The light emitting elements ED1 and ED2 are disposed adjacent to the rounded edge of the display area in the first direction DR1. The first and second light emitting elements ED1 and ED2 disposed in the straight line portion STR (refer to FIG. 1) are arranged similarly as the previous examples.

As shown in FIG. 21, in the rounded portion RND (refer to FIG. 1), the edges of the adjacent second light emitting element groups EDGr2 are shifted in the second direction DR2 and thus are not aligned. In the second row, as the second light emitting element groups EDGr2 are shifted to the right, the first light emitting element group EDGr1 may be shifted to the right. The distance second light emitting element groups EDGr2 that are adjacent to each other in the second direction DR2 are shifted by two widths of the second light emitting element ED2 in the rounded portion RND (refer to FIG. 1). In the second row, the number of first light emitting element groups EDGr1 is reduced by one compared to the first row.

For comparison, a comparative example display device may implement a rounded portion RND (refer to FIG. 1) by reducing the number of second light emitting element groups EDGr2 positioned in the second row by one. In the comparative example, the distance the edges of the second light emitting element groups EDGr2 that are adjacent to each other in the second direction DR2 are shifted may correspond to eight widths of the second light emitting element ED2 (rather than two widths as in FIG. 21 or four widths as in FIG. 20). As the shift distance increases, a step shape may become visible the rounded portion RND (refer to FIG. 1), and the edge may not be implemented as a smooth curved line. In the display device according to the embodiments, the rounded portion RND (refer to FIG. 1) may be prevented from being viewed as a step shape by reducing the shift distance. The edge may be implemented as a smooth curved line.

Hereinafter, referring to FIG. 22 to FIG. 24, a display device according to an embodiment will be described.

Figure 22:
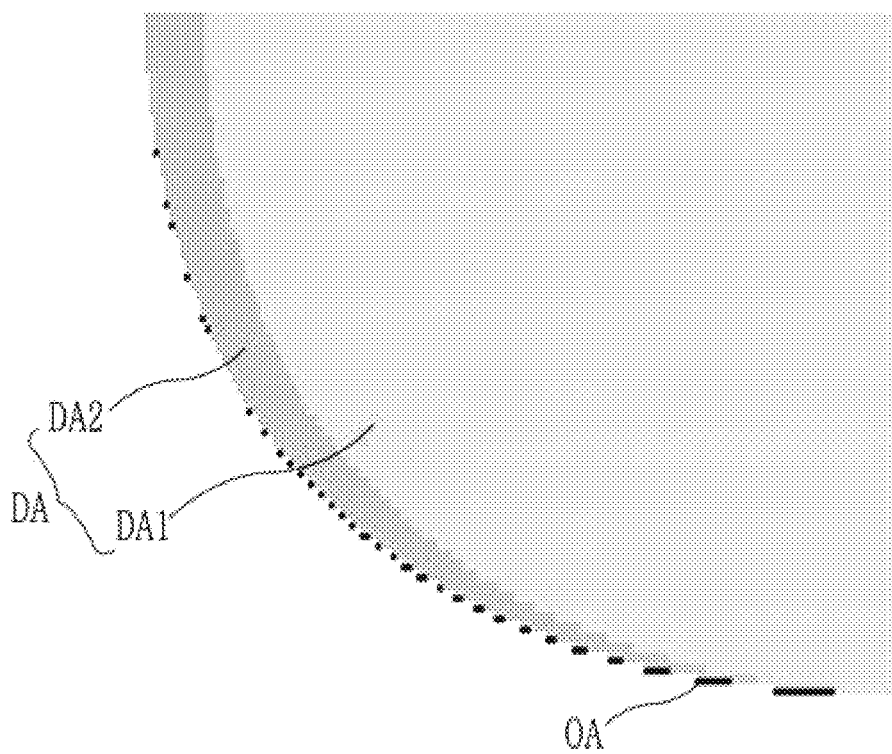
FIG. 22 is a top schematic plan view of some area of the display device according to the embodiment.
Figure 23:
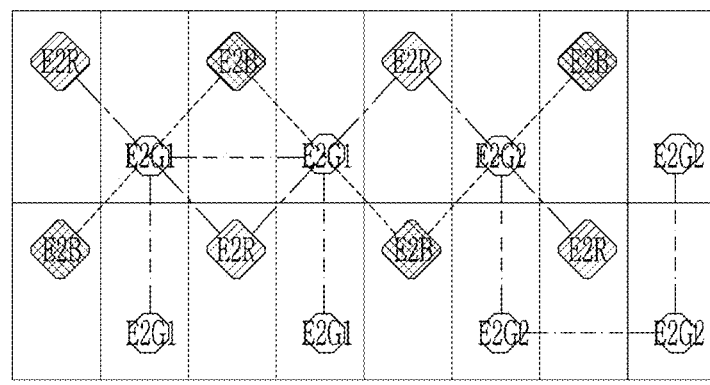
FIG. 23 and FIG. 24 show second light emitting elements positioned at edges of the display area of the display device according to the embodiment.
Figure 24:
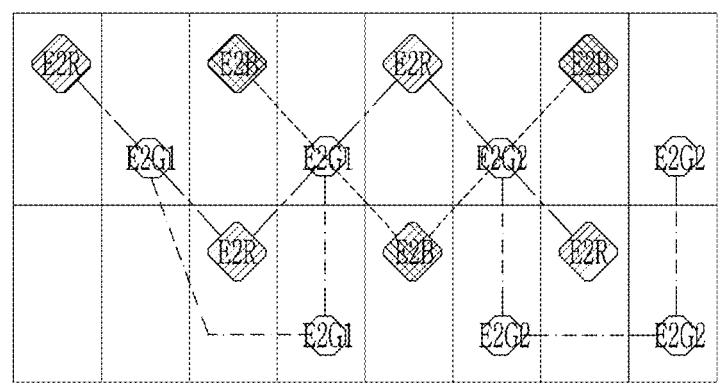
Figure 24:
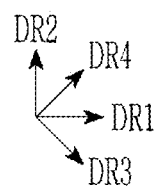

A display device according to an embodiment shown in FIG. 22 to FIG. 24 is almost the same as the embodiments shown in FIG. 1 to FIG. 21, and therefore, repetitive descriptions of the same elements will be omitted. The embodiments of FIG. 22 to FIG. 24 are different from the embodiments of FIG. 1 to FIG. 21 in that the number of second light emitting elements forming a second light emitting element group positioned in a straight line portion STR (refer to FIG. 1) of an edge of a display area is different from the number of second light emitting elements forming a second light emitting element group positioned in a round portion RND (refer to FIG. 1).

FIG. 22 is a schematic top plan view of an area of the display device according to the embodiment. FIG. 22 illustrates a rounded portion RND (refer to FIG. 1) and the periphery of a display area DA of the display device according to the embodiment. FIG. 22 shows a boundary between a first display area DA1 and a second display area DA2. FIG. 23 and FIG. 24 show second light emitting elements positioned at edges of the display area of the display device according to an embodiment. FIG. 23 shows second light emitting elements ED2 positioned in a straight line portion STR (refer to FIG. 1) of the edge of the display area DA, and FIG. 24 shows second light emitting elements ED2 positioned in the rounded portion RND (refer to FIG. 1) of the edge of the display area DA.

As shown in FIG. 22, the display area DA of the display device according to the embodiment includes a first display area DA1 and a second display area DA2. The second display area DA2 may be positioned at the edge of the display area DA. For example, the second display area DA2 may be positioned on the left edge and the right edge of the display area DA. The second display area DA2 may be positioned in the rounded portion RND (refer to FIG. 1) of the edge of the display area DA.

In the second display area DA2, a second pixel circuit portion PC2 is connected to multiple second light emitting elements ED2. Accordingly, the number of second light emitting elements ED2 forming a second light emitting element group EDGr2 is greater than the number of first light emitting elements ED1 forming a first light emitting element group EDGr1. As described in the previous embodiment, the second light emitting element group EDGr2 may be formed of eight, twelve, or sixteen second light emitting elements ED2. The number of second light emitting elements ED2 forming the second light emitting element group EDGr2 is not limited thereto, and may be changed.

As described above, when a rounded shape is implemented by changing the number of second light emitting element groups EDGr2, a stepped shape may be visible. In the embodiments of FIG. 1 to FIG. 21, the rounded shape may be smoothly implemented by shifting the second light emitting element group EDGr2 positioned in the rounded portion RND (refer to FIG. 1). In an embodiment, the rounded shape may be smoothly implemented by turning off some of the second light emitting elements ED2 forming the second light emitting element group EDGr2 positioned on the rounded portion RND (refer to FIG. 1). FIG. 22 shows an off area OA in which some of the second light emitting elements ED2 positioned in the rounded portion RND (refer to FIG. 1) may be in an off state. For example, a rounded shape may be implemented by changing the number of second light emitting elements ED2 forming the second light emitting element group EDGr2 positioned in the rounded portion RND (refer to FIG. 1). Therefore, the number of second light emitting elements ED2 forming the second light emitting element group EDGr2 positioned in the rounded portion RND (refer to FIG. 1) may be less than the number of second light emitting elements ED2 forming the second light emitting element group EDGr2 positioned in the straight line portion STR (refer to FIG. 1).

As shown in FIG. 23, the second light emitting element group EDGr2 positioned in the straight line portion STR (refer to FIG. 1) of the edge of the display area DA of the display device according to the embodiment may be formed of sixteen second light emitting elements ED2. In the second light emitting element group EDGr2, the sixteen second light emitting elements ED2 may be arranged in a matrix format of 2×8. The second light emitting element group EDGr2 may include four first sub-light emitting elements E2R, four second sub-light emitting elements E2B, four third sub-light emitting elements E2G1, and four fourth sub-light emitting elements E2G2. In the second light emitting element group EDGr2, the four first sub-light emitting elements E2R may be electrically connected to each other and may receive the same signal and exhibit the same luminance. In the second light emitting element group EDGr2, the four second sub-light emitting elements E2B may be electrically connected to each other and may receive the same signal and exhibit the same luminance. In the second light emitting element group EDGr2, the four third sub-light emitting elements E2G1 are electrically connected to each other and may receive the same signal and exhibit the same luminance. In the second light emitting element group EDGr2, the four fourth sub-light emitting elements E2G2 may be electrically connected to each other and may receive the same signal and exhibit the same luminance.

As shown in FIG. 24, the second light emitting element group EDGr2 positioned in the rounded portion RND (refer to FIG. 1) of the edge of the display area DA of the display device according to the embodiment may be formed of fourteen second light emitting elements ED2. The second light emitting element group EDGr2 may include four first sub-light emitting elements E2R, three second sub-light emitting elements E2B, three third sub-light emitting elements E2G1, and four fourth sub-light emitting elements E2G2. In the second light emitting element group EDGr2, the four first sub-light emitting elements E2R may be electrically connected to each other and may receive the same signal and exhibit the same luminance. In the second light emitting element group EDGr2, the three second sub-light emitting elements E2B may be electrically connected to each other and may receive the same signal and exhibit the same luminance. In the second light emitting element group EDGr2, the three third sub-light emitting elements E2G1 may be electrically connected to each other and may receive the same signal and exhibit the same luminance. In the second light emitting element group EDGr2, the four fourth sub-light emitting elements E2G2 may be electrically connected to each other and may receive the same signal and exhibit the same luminance.

The second light emitting element group EDGr2 disposed in the rounded portion RND (refer to FIG. 1) may have an arrangement form in which at least one second light emitting element ED2 disposed at the edge is off compared to a second light emitting element group EDGr2 disposed in the straight line portion STR (refer to FIG. 1). For example, in the second light emitting element group EDGr2 disposed in the rounded portion RND (refer to FIG. 1), a second sub-light emitting element E2B and a third sub-light emitting element E2G1 may be individually turned off. The turned off second sub-light emitting elements E2B and E2G1 may be disposed in the lower left end with respect to a second light emitting element group EDGr2 disposed in the straight line portion STR (refer to FIG. 1), where all the second light emitting elements EB2 are turned on. For example, in the second light emitting element group EDGr2 positioned in the rounded portion RND (refer to FIG. 1), second light emitting elements ED2 positioned at the first and second columns in the first row among the sixteen second light emitting elements ED2 may be turned off. However, this is only an example, and the number and positions of the second light emitting element ED2 that are turned off in the second light emitting element group EDGr2 positioned in the rounded portion RND (refer to FIG. 1) may be changed.

It is possible to turn off some second light emitting elements ED2 disposed in the rounded portion RND (refer to FIG. 1) through various methods. Hereinafter, referring to the embodiments of FIG. 25 to FIG. 27, the off area OA in which some second light emitting elements ED2 positioned in the rounded portion RND (refer to FIG. 1) are turned off will be described.

Figure 25:
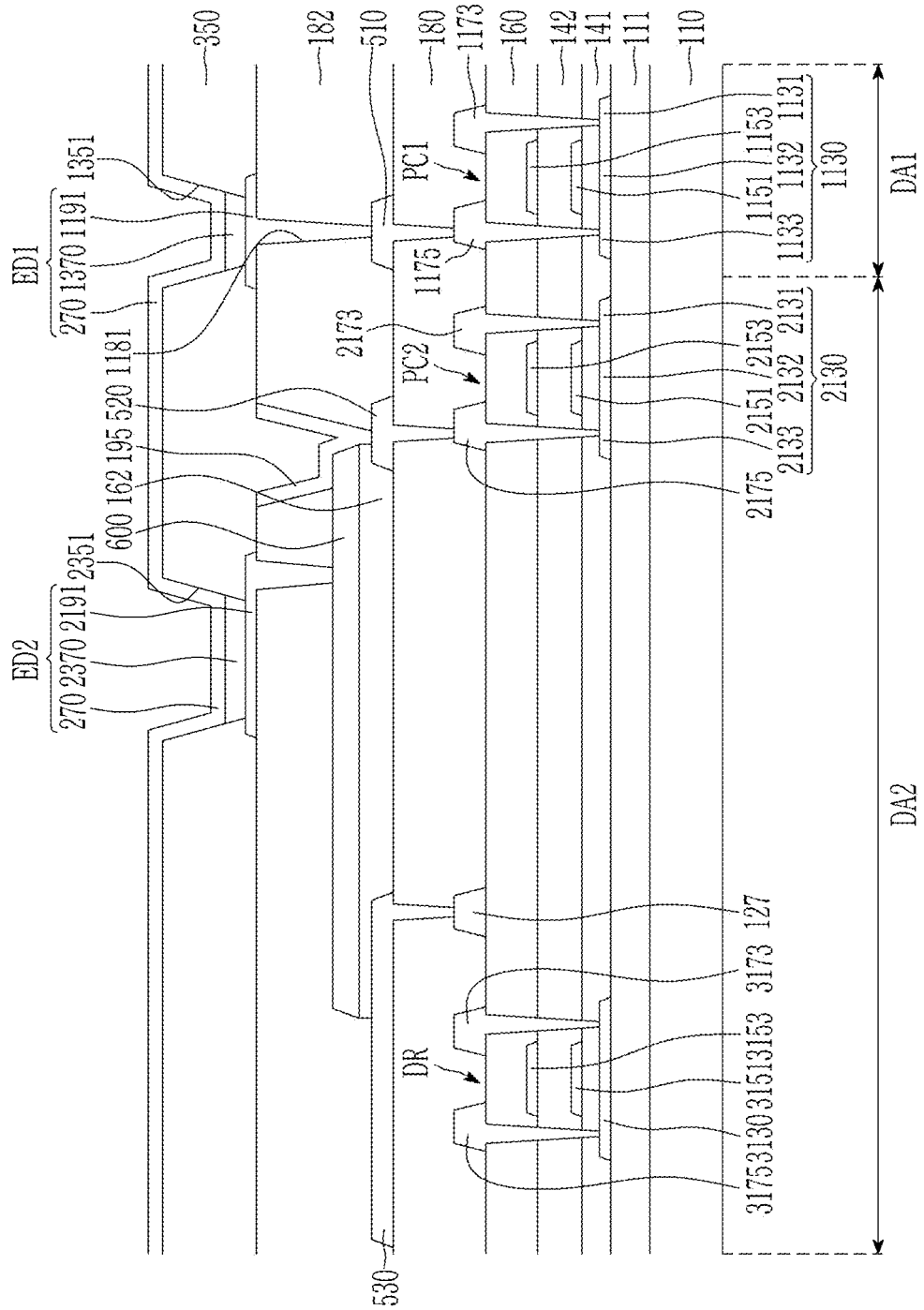
FIG. 25 to FIG. 27 are schematic cross-sectional views of a part of the display device according to the embodiment.
Figure 26:
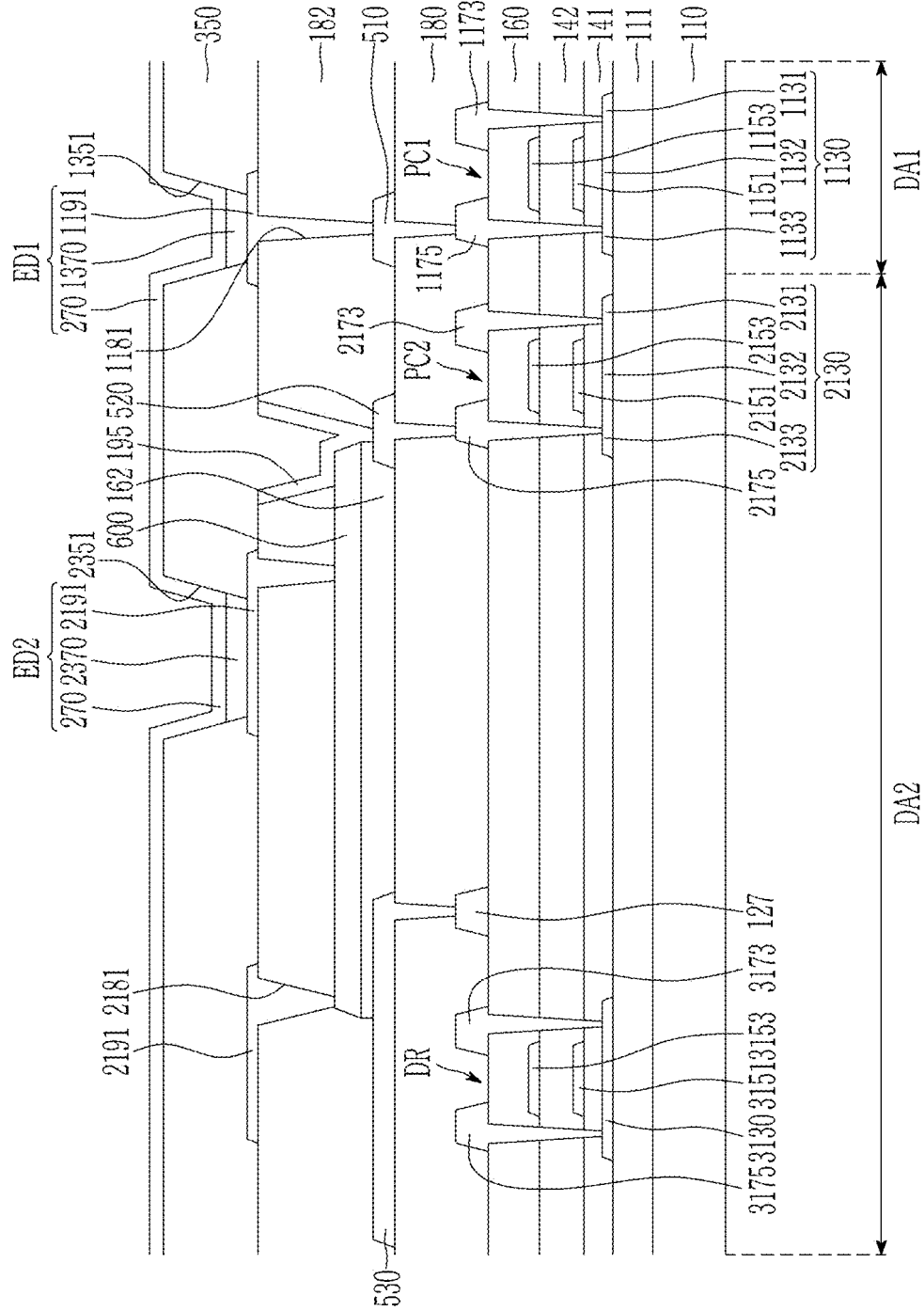
Figure 27:
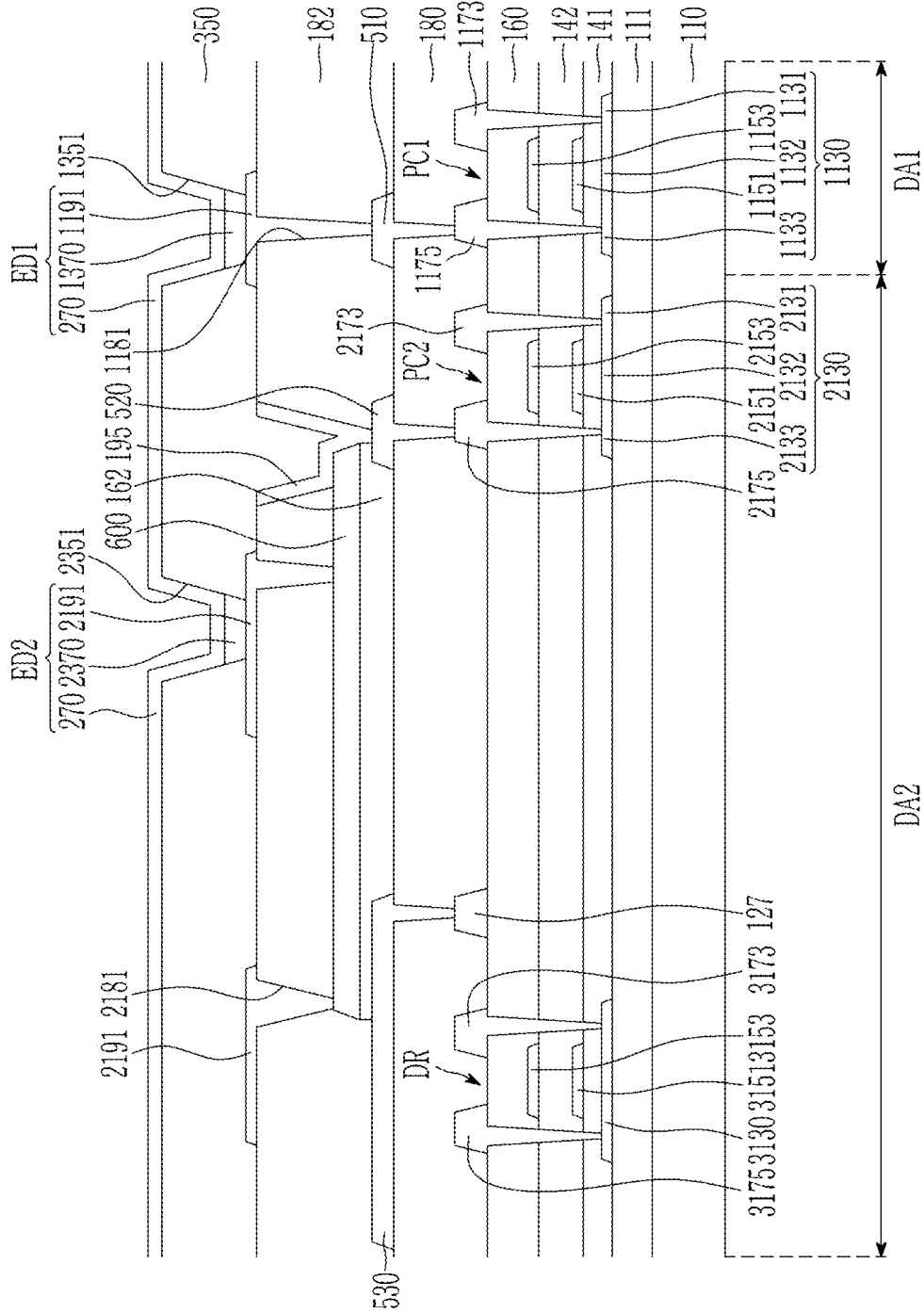

FIG. 25 to FIG. 27 are schematic cross-sectional views of a part of the display device according to the embodiment.

As shown in FIG. 25, second light emitting elements ED2 connected to a second pixel circuit portion PC2 may be removed from the rounded portion RND (refer to FIG. 1). For example, the pixel electrode 2191 and the emission layer 2370 may not be positioned in the off area OA. Unlike FIG. 3, FIG. 25 illustrates only one second light emitting element ED2. Although an extension wire 600 is illustrated in the off area OA, it is not limited thereto, and the extension wire 600 may also be removed from the off area OA.

As shown in FIG. 26, in the off area OA, a pixel electrode 2191 may be positioned but an emission layer 2370 may not be positioned in the off area OA. The pixel opening 2351 may not be formed in a partitioning wall 350 overlapping the pixel electrode 2191 positioned in the off area OA.

in other examples, both the pixel electrode 2191 and the emission layer 2370 may be disposed in the off area OA, and the pixel electrode 2191 positioned in the off area OA may block a signal from being transmitted from the extension wire 600. For example, an opening 2181 for connecting the pixel electrode 2191 and the extension wire 600 positioned in the off area OA may not be formed, or a part of the extension wire 600 may be disconnected.

As described, the amount of current transmitted from one second pixel circuit portion PC2 to the second light emitting elements ED2 may be increased by turning off some of the second light emitting elements ED2 positioned on the rounded portion RND (refer to FIG. 1). For example, the second light emitting element ED2 positioned in the rounded portion RND (refer to FIG. 1) may have higher luminance than the second light emitting element ED2 positioned in the straight line portion STR (refer to FIG. 1), and such a difference in luminance may be visible. As shown in FIG. 27, the luminance may be lowered by reducing a width Wpo of a pixel opening 2351 of the second light emitting element ED2 positioned in the rounded portion RND (refer to FIG. 1). The pixel opening 2351 of the second light emitting element ED2 in FIG. 27 is smaller than that of the second light emitting element ED2 in FIG. 26.

The number of second light emitting elements ED2 formed in the second light emitting element group EDGr2 positioned in the rounded portion RND (refer to FIG. 1) may be less than the number of second light emitting elements ED2 formed in the second light emitting element group EDGr2 positioned in the straight line portion STR (refer to FIG. 1). The width of an light emission area of the second light emitting elements ED2 forming the second light emitting element group EDGr2 having a relatively small number of second light emitting elements ED2 may be smaller than a width of a light emission area of the light emitting elements ED2 forming the second light emitting element group EDGr2 positioned in the straight line portion STR (refer to FIG. 1).

Hereinafter, a comparative example display device shown in FIG. 28 and the display device according to the embodiment will be compared and described.

Figure 28:
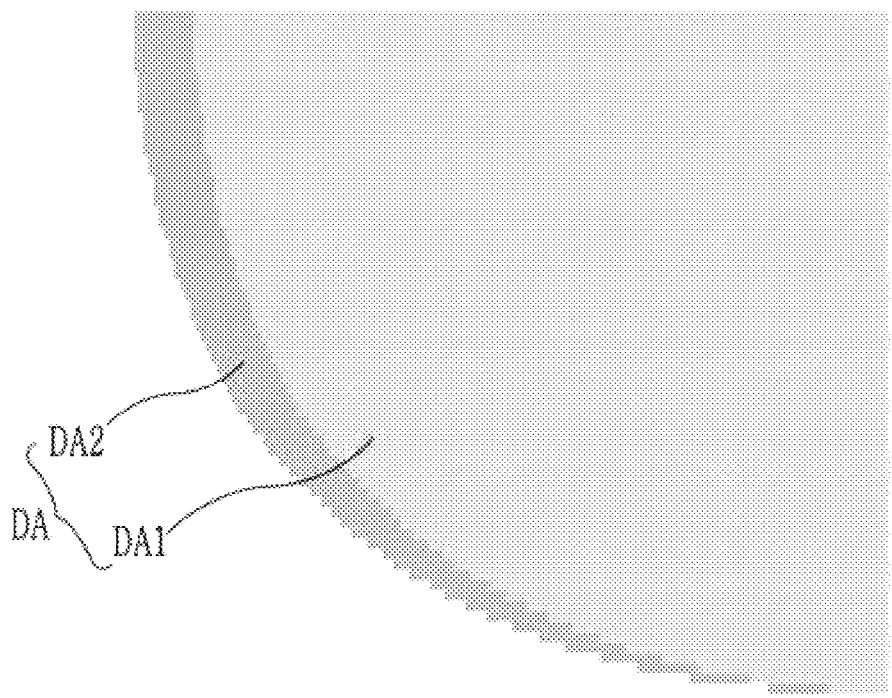
FIG. 28 is a top schematic plan view of a part of a display device according to a reference example.

FIG. 28 is a schematic top plan view of a part of a display device according to a comparative example. FIG. 28 shows a round portion of an edge of a display area of a display device according to a comparative example and its periphery. In the comparative example, the number of second light emitting elements ED2 forming a second light emitting element group EDGr2 positioned in a straight line portion STR (refer to FIG. 1) and in a rounded portion RND (refer to FIG. 1) may be the same. As shown in FIG. 28, the round portion of the edge of the display area is not implemented as a smooth curved line, and a step is visible. In contrast, the display device according to the embodiments, as shown in FIG. 22, may represent a smooth curved line shape by turning off some second light emitting elements ED2 positioned on the rounded portion RND (refer to FIG. 1).

Hereinafter, referring to FIG. 29, a display device according to an embodiment will be described.

Figure 29:
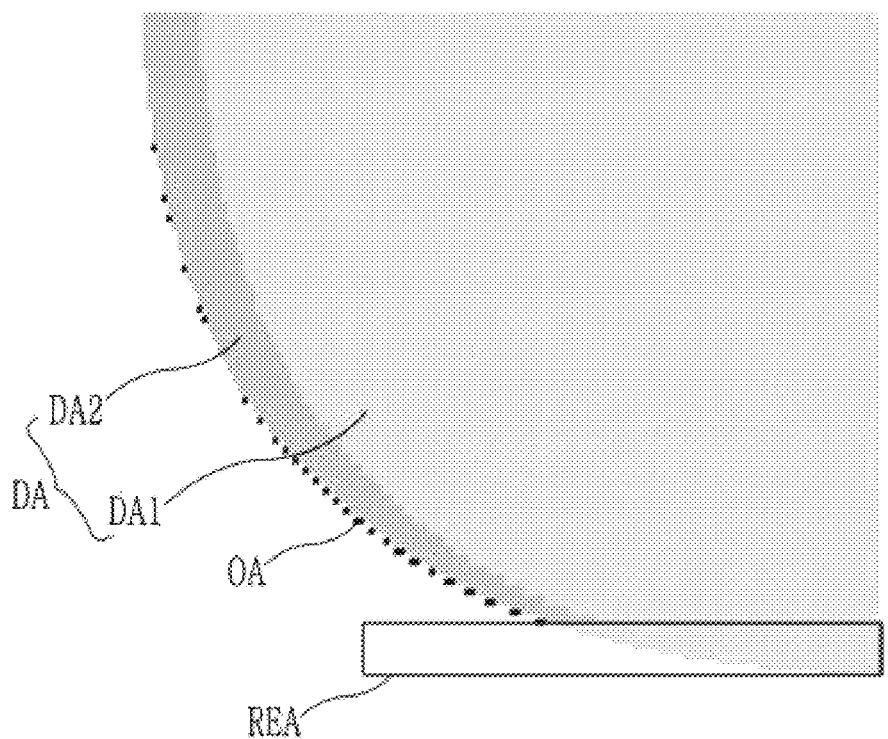
FIG. 29 is a top schematic plan view of some area of a display area according to an embodiment.

A display device according to an embodiment shown in FIG. 29 is almost the same as the display device according to the embodiment shown in FIG. 22 to FIG. 27, and repetitive descriptions of the same parts will be omitted. The embodiment is different from that of FIG. 22 in that a first display area instead of a second display area may be disposed in some regions of a rounded portion of an edge of a display area. This will be further described below.

FIG. 29 is a top plan view of an area of a display area according to an embodiment.

As shown in FIG. 29, a display area DA of a display device according to an embodiment includes a first display area DA1 and a second display area DA2. The first display area DA1 or the second display area DA2 may be positioned at an edge of the display area DA.

In an embodiment, the second display area DA2 may be disposed and the first display area DA1 may not be disposed in the rounded portion RND (refer to FIG. 1) of the edge of the display area DA. In the embodiment, the second display area DA2 may be positioned on a part of the rounded portion RND (refer to FIG. 1) of the edge of the display area DA, and the first display area DA1 may be positioned on the remaining part. The first display area DA1 is positioned at an end REA of the rounded portion RND (refer to FIG. 1) rather than the second display area DA2.

The second light emitting element ED2 in the second light emitting element group EDGr2 may be arranged in a matrix format such as 2×4, 2×6, 2×8, and the like. Accordingly, the second light emitting element group EDGr2 may have a shape extending long in the row direction. Accordingly, as shown in FIG. 28, it can be observed that a step shape is more recognized as it goes to the lower end of the rounded portion RND (refer to FIG. 1).

The first display area DA1 may be disposed instead of the second display area DA2 in the lower end REA of the rounded portion RND (refer to FIG. 1) in the embodiment. The number of first light emitting elements ED1 in the first light emitting element group EDGr1 positioned in the first display area DA1 is less than the number of the second light emitting elements ED2 in the second light emitting element group EDGr2 positioned in the second display area DA2, and therefore the rounded portion RND (refer to FIG. 1) can be implemented as a smoother curved line. FIG. 29 shows a rounded portion RND (refer to FIG. 1) positioned at the lower left of the display area DA. Although not shown, even in the case of the rounded portion RND (refer to FIG. 1) positioned at the lower right of the display area DA, the first display area DA1 may be positioned at the lower end of the rounded portion RND (refer to FIG. 1) instead of the second display area DA2. In the rounded portion RND (refer to FIG. 1) positioned at the upper left and upper right of the display area DA, the first display area DA1 is positioned at an upper end of the rounded portion RND (refer to FIG. 1) instead of the second display area DA2.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a display area, the display area including:
   a first display area; and
   a second display area;
   a first pixel circuit portion that is disposed on the first display area;
   a first light emitting element that is electrically connected to the first pixel circuit portion;
   a second pixel circuit portion that is disposed on the second display area;
   second light emitting elements that are electrically connected to the second pixel circuit portion; and
   a driving circuit portion that is electrically connected to the first pixel circuit portion and to the second pixel circuit portion, and overlapping at least one of the second light emitting elements, in a plan view, wherein, an edge of the display area includes:
  a straight line portion having a straight line shape; and
  a rounded portion having a rounded shape, and
an arrangement form of the second light emitting elements disposed in the straight line portion and an arrangement form of the second light emitting elements disposed in the rounded portion are different.

2. The display device of claim 1, further comprising:
light emitting element groups, each of the light emitting element groups including eight of the second light emitting elements that are adjacent to each other in a first direction, and in a second direction that is perpendicular to the first direction, wherein
the second pixel circuit portion is electrically connected to two of the second light emitting elements,
edges of the light emitting element groups that are adjacent to each other in the second direction and are disposed in the straight line portion are aligned with each other, and
edges of light emitting element groups that are adjacent to each other in the second direction and are disposed in the rounded portion are shifted and not aligned with each other.

3. The display device of claim 2, wherein
the eight of the second light emitting elements of each of the light emitting element groups are arranged in a matrix format of 2×4, and
a distance the edges of light emitting element groups that are adjacent to each other in the second direction and disposed in the rounded portion are shifted from each other corresponds to one or two widths of one of the second light emitting elements.

4. The display device of claim 1, further comprising:
light emitting element groups, each of the light emitting element groups including twelve of the second light emitting elements that are adjacent to each other in a first direction, and in a second direction that is perpendicular to the first direction, wherein
the second pixel circuit portion is electrically connected to three second light emitting elements,
edges of the light emitting element groups that are adjacent to each other in the second direction and are disposed in the straight line portion are aligned with each other, and
edges of light emitting element groups that are adjacent to each other in the second direction and are disposed in the rounded portion are shifted and not aligned with each other.

5. The display device of claim 4, wherein
the twelve of the second light emitting elements of each of the light emitting element groups are arranged in a matrix format of 2×6, and
a distance the edges of light emitting element groups that are adjacent to each other in the second direction and disposed in the rounded portion are shifted from each other corresponds to two or four widths of one of the second light emitting elements.

6. The display device of claim 1, further comprising:
light emitting element groups, each of the light emitting element groups including sixteen of the second light emitting elements that are adjacent to each other in a first direction, and in a second direction that is perpendicular to the first direction, wherein
four second light emitting elements are electrically connected to the second pixel circuit portion,
edges of the light emitting element groups that are adjacent to each other in the second direction and are disposed in the straight line portion are aligned with each other, and
edges of the light emitting element groups that are adjacent to each other in the second direction and are disposed in the rounded portion are shifted and not aligned with each other.

7. The display device of claim 6, wherein
the sixteen light emitting elements of each of the light emitting element groups are arranged in a matrix format of 2×8, and
a distance the edges of light emitting element groups that are adjacent to each other in the second direction and disposed in the rounded portion are shifted from each other corresponds to two or four widths of one of the second light emitting elements.

8. The display device of claim 1, wherein
the second pixel circuit portion includes:
  a first sub-pixel circuit portion;
  a second sub-pixel circuit portion;
  a third sub-pixel circuit portion; and
  a fourth sub-pixel circuit portion, and
each of the second light emitting elements includes:
  first sub-light emitting elements that are electrically connected to the first sub-pixel circuit portion;
  second sub-light emitting elements that are electrically connected to the second sub-pixel circuit portion;
  third sub-light emitting elements that are electrically connected to the third sub-pixel circuit portion; and
  fourth sub-light emitting elements that are electrically connected to the fourth sub-pixel circuit portion.

9. The display device of claim 8, wherein
the first sub-light emitting elements emit red light,
the second sub-light emitting elements emit blue light, and
the third sub-light emitting elements and the fourth sub-light emitting elements emit green light.

10. The display device of claim 1, further comprising:
an extension wire that electrically connects the second pixel circuit portion to the second light emitting elements.

11. The display device of claim 1, further comprising:
a peripheral area surrounding the display area, wherein
the display area displays an image,
the second display area is disposed between the first display area and the peripheral area,
a part of the driving circuit portion overlaps the second display area in a plan view, and
a remaining part of the driving circuit portion overlaps the peripheral area in a plan view.

12. The display device of claim 1, further comprising:
light emitting element groups, each of the light emitting element groups including at least one of the second light emitting elements that are adjacent to each other in a first direction, and in a second direction that is perpendicular to the first direction, wherein
a number of second light emitting elements included in one of the light emitting element groups disposed in the rounded portion and a number of second light emitting elements included in one of the light emitting element groups disposed in the straight line portion are different.

13. The display device of claim 12, wherein the number of second light emitting elements included in one of the light emitting element groups disposed in the rounded portion is less than the number of second light emitting elements included in one of the light emitting element groups disposed in the straight line portion.

14. The display device of claim 12, wherein at least one of the light emitting element groups disposed in the rounded portion includes at least one of the second light emitting elements that is disposed on the edge with reference to a light emitting element group disposed in the straight line portion and is turned off.

15. The display device of claim 14, wherein
sixteen of the second light emitting elements included in one of the light emitting element groups that are disposed in the straight line portion are arranged in a matrix format of 2×8, and
the light emitting element groups that are disposed in the rounded portion have an arrangement form in which second light emitting elements disposed in a second row and a first column, and the second row and a second column are turned off.

16. The display device of claim 14, wherein at least one of the second light emitting elements comprises:
a pixel electrode electrically connected to the second pixel circuit portion;
an emission layer disposed on the pixel electrode; and
a common electrode disposed on the emission layer.

17. The display device of claim 16, wherein in an area where at least one of the second light emitting elements is turned off, the pixel electrode and the emission layer are not disposed.

18. The display device of claim 16, wherein in an area where at least one of the second light emitting elements is turned off, the pixel electrode is disposed, and the emission layer is not disposed.

19. The display device of claim 14, wherein a width of a light emitting area of at least one of the second light emitting elements of the light emitting element group among the light emitting element groups disposed in the rounded portion is narrower than a width of a light emitting area of at least one of the second light emitting elements of the light emitting element group among the light emitting element groups disposed in the straight line portion.

20. The display device of claim 12, wherein
a portion of the first display area is disposed in an end of the rounded portion, and
the second display area is not disposed in the end of the rounded portion.

* * * * *